US010796118B2

(12) United States Patent
De Filippis et al.

(10) Patent No.: US 10,796,118 B2
(45) Date of Patent: Oct. 6, 2020

(54) MULTIPURPOSE ENCLOSURE BOSS ASSEMBLY

(71) Applicant: Datalogic IP Tech S.r.l., Bologna (IT)

(72) Inventors: Michele De Filippis, Bologna (IT); Davide Bruni, Bologna (IT)

(73) Assignee: Datalogic IP Tech S.R.L., Bologna (IT)

( * ) Notice: Subject to any disclaimer, the term of this patent is extended or adjusted under 35 U.S.C. 154(b) by 0 days.

(21) Appl. No.: 16/221,455

(22) Filed: Dec. 15, 2018

(65) Prior Publication Data

US 2020/0193108 A1 Jun. 18, 2020

(51) Int. Cl.
*G06K 7/10* (2006.01)
*G01D 11/24* (2006.01)

(52) U.S. Cl.
CPC ....... *G06K 7/10821* (2013.01); *G01D 11/245* (2013.01); *G06K 7/10425* (2013.01)

(58) Field of Classification Search
CPC .......... G06K 7/10821; G06K 7/10425; G01D 11/245
USPC ............. 235/454; 174/58, 50, 54, 63, 66, 51
See application file for complete search history.

(56) References Cited

U.S. PATENT DOCUMENTS

| | | | | |
|---|---|---|---|---|
| 7,709,735 B2 * | 5/2010 | Vigorito | ................. | H02G 3/081 174/53 |
| 8,273,985 B2 * | 9/2012 | Lin | ........................ | H02G 3/088 174/50 |
| 9,070,007 B2 | 6/2015 | Mistkawi et al. | | |

OTHER PUBLICATIONS

Datalogic Gryphon | GFS4400 Bar Code Reader, Rev. D, Jan. 2017, 44 pages.

* cited by examiner

*Primary Examiner* — Karl D Frech
(74) *Attorney, Agent, or Firm* — The Juhasz Law Firm

(57) ABSTRACT

A boss assembly includes: a first boss formed integrally with a first portion of an enclosure that cooperates with a second portion thereof to enclose a volume, wherein the first passage communicates between the enclosed volume at an internal aperture and an external environment at an external aperture; an enclosure screw having an enlarged head to retain the enclosure screw within the first passage and an elongate threaded shaft portion to extend out of the first passage through the internal aperture, into the interior volume and into a second passage of a second boss of the second portion; and a threaded insert that is sized to engage interior surfaces of the first passage with a tight fit when inserted therein between the head of the enclosure screw and the external aperture, wherein the first threaded insert defines a threaded third passage that extends therethrough.

23 Claims, 16 Drawing Sheets

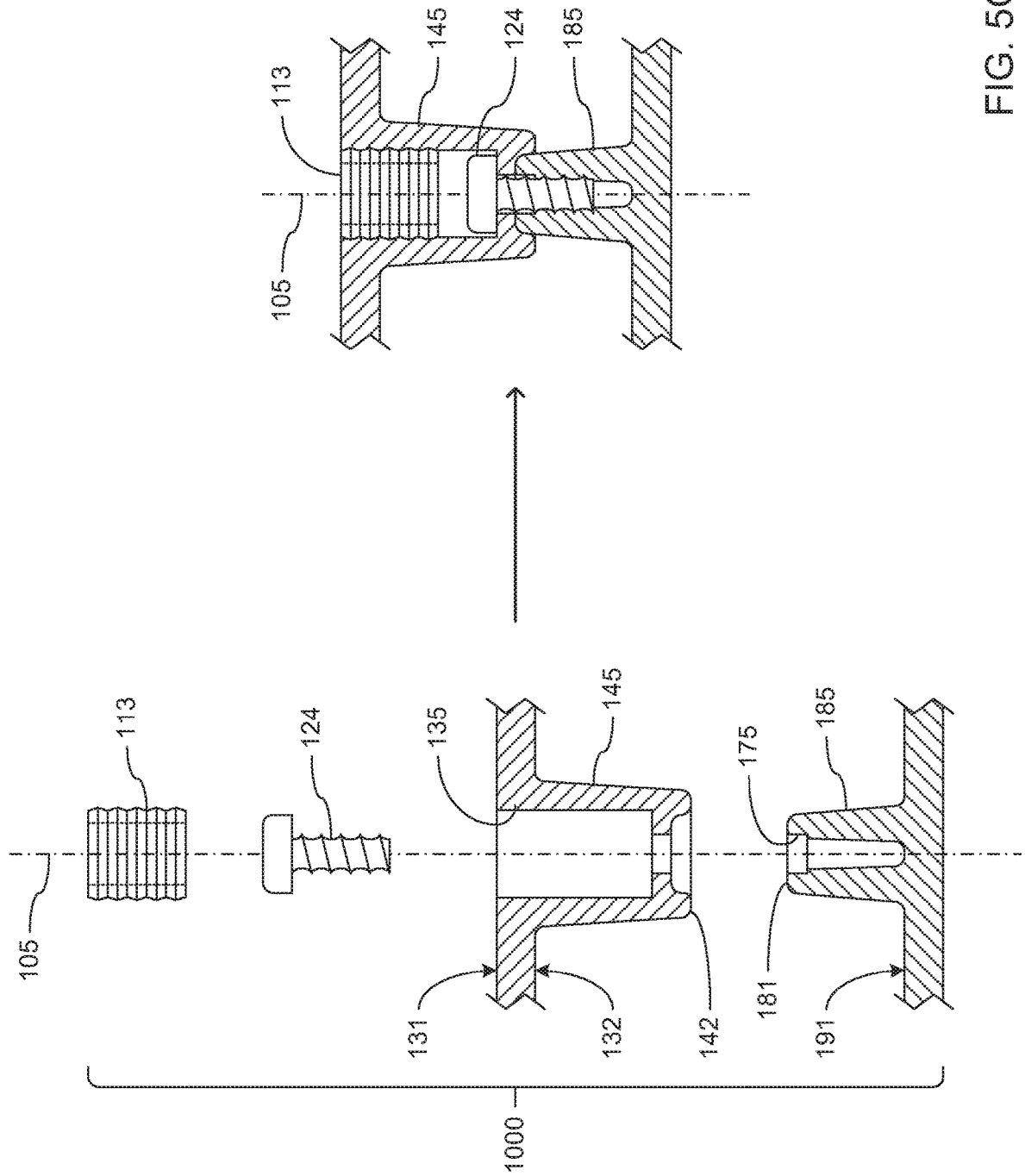

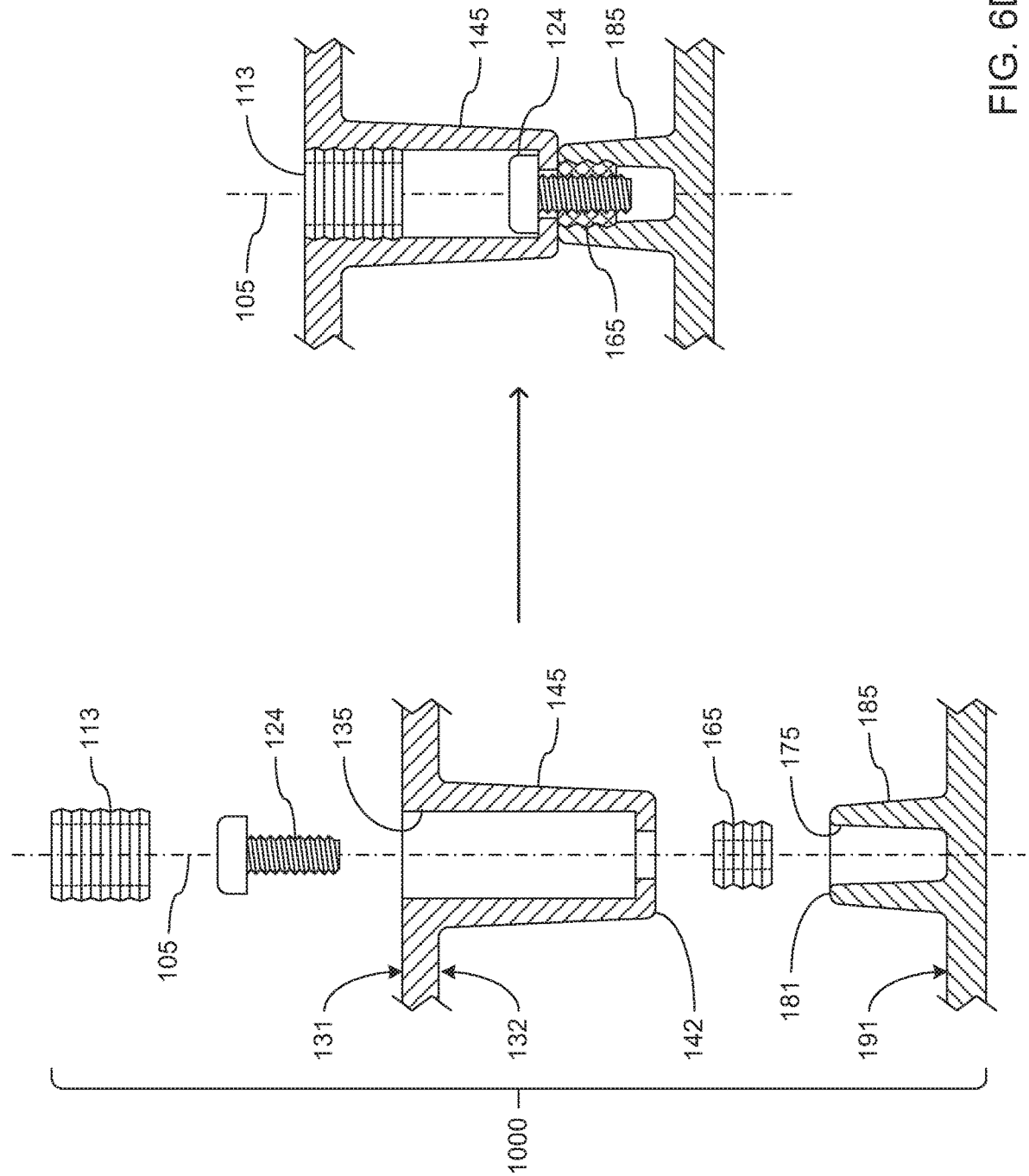

MULTIPURPOSE ENCLOSURE BOSS ASSEMBLY

BACKGROUND OF THE INVENTION

1. Field of the Invention

The present invention relates to boss assemblies used for the dual purposes of assembling enclosures of electronic devices and of affixing such assembled enclosures to structures at locations at which the electronic devices are to perform their functions.

2. Description of the Related Art

The use of bosses molded into portions of an electronic device enclosure for use in assembling those portions into a complete enclosure is well known. The use of other bosses also molded into portions of an electronic device enclosure, and carrying threaded inserts for use in affixing the completed enclosure to a portion of a structure, is also well known.

Such an enclosed electronic device may be an optical scanning device that scans the surfaces of various objects to locate, capture and/or decode indicia that may be applied to such surfaces and that may encode data. Alternatively or additionally, such an enclosed electronic device may be a radio frequency identification (RFID) tag reader that employs electromagnetic signals to wirelessly retrieve data stored in RFID tags incorporated into various objects.

By way of example, electronic components of such an optical scanner may be enclosed within an enclosure that is affixed to structure adjacent to a path of movement of objects that are carried along a conveyor belt, or that are carried through a doorway of a building. More specifically, such an optical scanner may be positioned adjacent such a pathway to place surfaces of such objects that may carry indicia that encodes data within the field of view (FOV) of an electronic component that performs optical scanning. Alternatively or additionally, such an RFID reader may be similarly affixed adjacent such a pathway to place the RFID tags carried by such objects within sufficiently close range as to enable an electronic component of the RFID reader to use electromagnetic fields to retrieve data therefrom.

As will be familiar to those skilled in the art, it is commonplace practice for both the bosses that are used to assemble such an enclosure and the bosses that are used to affix such an enclosure to other structures to extend into the interior volume that is enclosed by such an enclosure. As such electronic devices are normally designed to be of relatively small size to be relatively unobtrusive where they are used, the size of the interior volume is often quite limited, and so it is usually deemed desirable to limit the amount of the interior volume that is lost to the intrusion of such bosses to the degree possible.

As will also be familiar to those skilled in the art, it is a commonplace practice to use the fact that such bosses extend into the interior volume to provide a mechanism by which circuitboards and/or other electronic components may be secured at fixed locations within the interior volume. Indeed, it is a commonplace practice to form one or more cutouts through such circuitboards through which such bosses are caused to extend as part of such a securing mechanism. However, each such cutout that is formed through a circuitboard defines a portion of the surface area of the circuitboard at which no electronic components are able to be mounted, and so it may be deemed desirable to limit the quantity of such cutouts so as to avoid the need to make the circuitboard larger to compensate for the presence of multiple cutouts.

However, making the circuitboard larger may require making the enclosure larger, thus creating a conflict among the goals of minimizing the overall size of an electronic device, providing a circuitboard that is sufficiently large to carry all of the electronic components that need to be carried thereon, and incorporating a sufficient quantity of bosses as to enable the enclosure to be properly assembled and to enable the enclosure to be affixed to other structure so that the electronic device may be effectively used.

Thus, a form of boss assembly that is able to perform both functions is needed.

SUMMARY OF THE INVENTION

Techniques are described for providing a multipurpose boss assembly that makes more efficient use of the interior volume of an enclosure of an electronic device by serving the dual functions of enabling the assembly of such enclosures and enabling such enclosures to be affixed to other structure.

A boss assembly includes a first boss formed integrally with a first portion of an enclosure, wherein: the first portion of the enclosure cooperates with at least a second portion of the enclosure to at least partly enclose an interior volume; the first boss defines a first passage that extends through the first boss; and the first passage defines an external aperture where the first passage opens into an environment external to the enclosure through an external surface of the first portion of the enclosure, and an internal aperture where the first passage opens into the interior volume. The boss assembly also includes an enclosure screw having an elongate threaded shaft portion and a head formed at a head end of the threaded shaft portion, wherein: the enclosure screw is inserted into the first passage in an orientation that causes the head to extend toward the external aperture, and that causes a threaded end of the threaded shaft portion that is opposite the head end to extend through the internal aperture, into the interior volume and toward a second passage defined by a second boss of the second portion of the enclosure; and the head is enlarged relative to the head end of the threaded shaft portion to provide an annular screw shoulder to engage an annular aperture shoulder within the first passage that surrounds the internal aperture to retain the head end of the enclosure screw within the first passage. The boss assembly further includes a first threaded insert that is sized to engage interior surfaces of the first passage with a tight fit when inserted into the first passage, wherein: the first threaded insert is secured within the first passage at a location closer to the external aperture than the internal aperture, and with the head of the enclosure screw disposed between the first threaded insert and the aperture shoulder surrounding the internal aperture; and the first threaded insert defines a threaded third passage that extends through the first threaded insert.

An enclosure to enclose an interior volume includes a first portion of the enclosure that includes a first boss formed integrally therewith, wherein: the first boss defines a first passage that extends through the first boss; and the first passage defines an external aperture where the first passage opens into an environment external to the enclosure through an external surface of the first portion of the enclosure, and an internal aperture where the first passage opens into an interior volume. The enclosure also includes a second portion of the enclosure that includes a second boss formed integrally therewith, wherein: the second portion of the enclosure cooperates with at least the first portion of the enclosure to at least partly enclose the interior volume; the second boss defines a second passage that extends at least partially through the second boss; and the second passage opens into the interior volume. The enclosure further includes an enclosure screw having an elongate threaded shaft portion and a head formed at a head end of the threaded shaft portion, wherein: the enclosure screw is inserted into the first passage in an orientation that causes the head to extend toward the external aperture, and that causes a threaded end of the threaded shaft portion that is opposite the head end to extend through the internal aperture, into the interior volume and toward the second passage of the second boss; and the head is enlarged relative to the head end of the threaded shaft portion to provide an annular screw shoulder to engage an annular aperture shoulder within the first passage that surrounds the internal aperture to retain the head end of the enclosure screw within the first passage. The enclosure still further includes a first threaded insert that is sized to engage interior surfaces of the first passage with a tight fit when inserted into the first passage, wherein: the first threaded insert is secured within the first passage at a location closer to the external aperture than the internal aperture, and with the head of the enclosure screw disposed between the first threaded insert and the aperture shoulder surrounding the internal aperture; and the first threaded insert defines a threaded third passage that extends through the first threaded insert.

A method of assembling an enclosure that encloses an interior volume, includes forming a first boss integrally with a first portion of the enclosure to extend into the interior volume and to define a first passage that extends through the first boss to communicate between the interior volume and an environment external to the enclosure, wherein: the first passage defines an external aperture where the first passage opens into the external environment through an external surface of the first portion of the enclosure; and the first passage defines an internal aperture where the first passage opens into the interior volume through a first engagement surface of the first boss. The method also includes forming a second boss integrally with a second portion of the enclosure to extend into the interior volume and defines a second passage that extends at least partially through the second boss, wherein the second passage opens into the interior volume through a second engagement surface of the second boss; and inserting an enclosure screw having an elongate threaded shaft portion and a head formed at a head end of the threaded shaft portion into the first passage in an orientation that causes the head to extend toward the external aperture, and that causes a threaded end of the threaded shaft portion that is opposite the head end to extend through the internal aperture, into the enclosed volume and toward the second passage of the second boss, wherein: the head is enlarged relative to the head end of the threaded shaft portion to provide an annular screw shoulder to engage an annular aperture shoulder within the first passage that surrounds the internal aperture to retain the head end of the enclosure screw within the first passage; and the head carries a tool engagement formation to enable the enclosure screw to be engaged with an engagement tip of a tool to rotate the enclosure screw within the first passage to cause the threaded end of the enclosure screw to engage interior surfaces of the second passage to draw together the first and second portions of the enclosure to enclose the interior volume. The method further includes inserting a first threaded insert into the first passage through the external aperture, wherein: the first threaded insert is sized to engage interior surfaces of the first passage that surround the external aperture with a tight fit to secure the first threaded insert within the first passage at a location closer to the external aperture than the internal aperture, and with the head of the enclosure screw disposed between the first threaded insert and the aperture shoulder surrounding the internal aperture; and the first threaded insert defines a threaded third passage that extends through the first threaded insert to receive and engage an elongate threaded portion of a mounting screw inserted into the third passage from the environment external to the enclosure. The method still further includes inserting the engagement tip through the threaded third passage to engage the tool engagement formation of the enclosure screw; and with the threaded end of the enclosure screw extending through the internal aperture of the first passage of the first boss and into the second passage of the second boss, and with the engagement tip of the tool engaging the engagement formation of the head of the enclosure screw, operating the tool to cause rotation of the enclosure screw to draw together the first portion and the second portion of the enclosure to cause cooperation between at least the first portion and the second portion of the enclosure to enclose the internal volume.

BRIEF DESCRIPTION OF THE DRAWINGS

FIGS. 5A, 5B, 5C and 5D, collectively referred to herein as FIG. 5, shows aspects of multiple different example implementations of a boss assembly of the enclosure of FIG. 3.

FIGS. 6A, 6B, 6C and 6D, collectively referred to herein as FIG. 6, shows aspects of multiple different example implementations of a boss assembly of the enclosure of FIG. 4.

DETAILED DESCRIPTION OF THE INVENTION

Figure 1A:
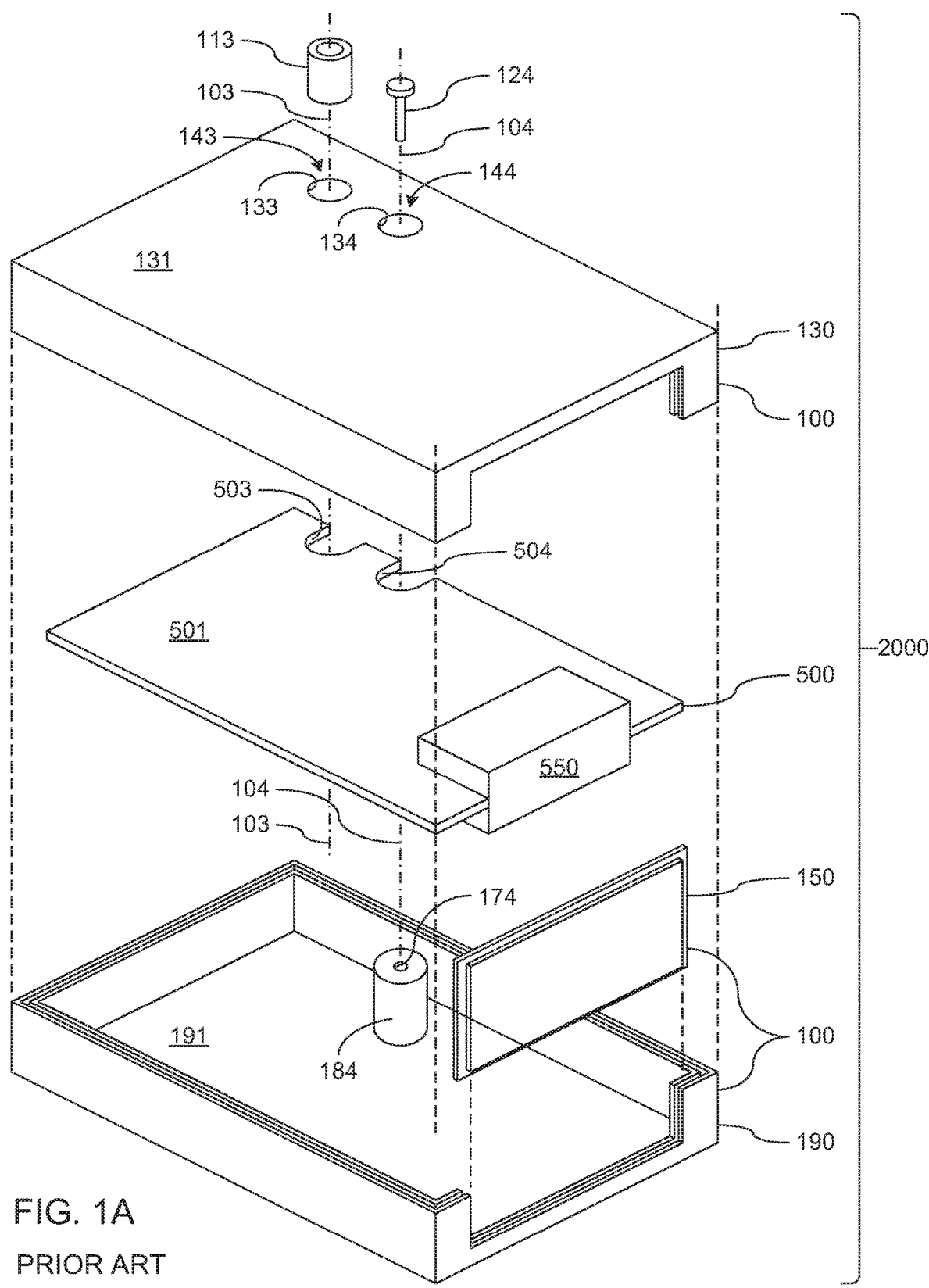
FIGS. 1A, 1B and 1C, collectively referred to herein as FIG. 1, shows aspects of an example implementation of a prior art enclosure.

In the following detailed description, reference is made to the accompanying drawings that form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

Disclosed herein is a multipurpose boss assembly used for the dual purposes of assembling an enclosure of an electronic device and of affixing such an assembled enclosure to a structure at a location at which the electronic device is to perform its function.

A boss assembly includes a first boss formed integrally with a first portion of an enclosure, wherein: the first portion of the enclosure cooperates with at least a second portion of the enclosure to at least partly enclose an interior volume; the first boss defines a first passage that extends through the first boss; and the first passage defines an external aperture where the first passage opens into an environment external to the enclosure through an external surface of the first portion of the enclosure, and an internal aperture where the first passage opens into the interior volume. The boss assembly also includes an enclosure screw having an elongate threaded shaft portion and a head formed at a head end of the threaded shaft portion, wherein: the enclosure screw is inserted into the first passage in an orientation that causes the head to extend toward the external aperture, and that causes a threaded end of the threaded shaft portion that is opposite the head end to extend through the internal aperture, into the interior volume and toward a second passage defined by a second boss of the second portion of the enclosure; and the head is enlarged relative to the head end of the threaded shaft portion to provide an annular screw shoulder to engage an annular aperture shoulder within the first passage that surrounds the internal aperture to retain the head end of the enclosure screw within the first passage. The boss assembly further includes a first threaded insert that is sized to engage interior surfaces of the first passage with a tight fit when inserted into the first passage, wherein: the first threaded insert is secured within the first passage at a location closer to the external aperture than the internal aperture, and with the head of the enclosure screw disposed between the first threaded insert and the aperture shoulder surrounding the internal aperture; and the first threaded insert defines a threaded third passage that extends through the first threaded insert.

An enclosure to enclose an interior volume includes a first portion of the enclosure that includes a first boss formed integrally therewith, wherein: the first boss defines a first passage that extends through the first boss; and the first passage defines an external aperture where the first passage opens into an environment external to the enclosure through an external surface of the first portion of the enclosure, and an internal aperture where the first passage opens into an interior volume. The enclosure also includes a second portion of the enclosure that includes a second boss formed integrally therewith, wherein: the second portion of the enclosure cooperates with at least the first portion of the enclosure to at least partly enclose the interior volume; the second boss defines a second passage that extends at least partially through the second boss; and the second passage opens into the interior volume. The enclosure further includes an enclosure screw having an elongate threaded shaft portion and a head formed at a head end of the threaded shaft portion, wherein: the enclosure screw is inserted into the first passage in an orientation that causes the head to extend toward the external aperture, and that causes a threaded end of the threaded shaft portion that is opposite the head end to extend through the internal aperture, into the interior volume and toward the second passage of the second boss; and the head is enlarged relative to the head end of the threaded shaft portion to provide an annular screw shoulder to engage an annular aperture shoulder within the first passage that surrounds the internal aperture to retain the head end of the enclosure screw within the first passage. The enclosure still further includes a first threaded insert that is sized to engage interior surfaces of the first passage with a tight fit when inserted into the first passage, wherein: the first threaded insert is secured within the first passage at a location closer to the external aperture than the internal aperture, and with the head of the enclosure screw disposed between the first threaded insert and the aperture shoulder surrounding the internal aperture; and the first threaded insert defines a threaded third passage that extends through the first threaded insert.

A method of assembling an enclosure that encloses an interior volume, includes forming a first boss integrally with a first portion of the enclosure to extend into the interior volume and to define a first passage that extends through the first boss to communicate between the interior volume and an environment external to the enclosure, wherein: the first passage defines an external aperture where the first passage opens into the external environment through an external surface of the first portion of the enclosure; and the first passage defines an internal aperture where the first passage opens into the interior volume through a first engagement surface of the first boss. The method also includes forming a second boss integrally with a second portion of the enclosure to extend into the interior volume and defines a second passage that extends at least partially through the second boss, wherein the second passage opens into the interior volume through a second engagement surface of the second boss; and inserting an enclosure screw having an elongate threaded shaft portion and a head formed at a head end of the threaded shaft portion into the first passage in an orientation that causes the head to extend toward the external aperture, and that causes a threaded end of the threaded shaft portion that is opposite the head end to extend through the internal aperture, into the enclosed volume and toward the second passage of the second boss, wherein: the head is enlarged relative to the head end of the threaded shaft portion to provide an annular screw shoulder to engage an annular aperture shoulder within the first passage that surrounds the internal aperture to retain the head end of the enclosure screw within the first passage; and the head carries a tool engagement formation to enable the enclosure screw to be engaged with an engagement tip of a tool to rotate the enclosure screw within the first passage to cause the threaded end of the enclosure screw to engage interior surfaces of the second passage to draw together the first and second portions of the enclosure to enclose the interior volume. The method further includes inserting a first threaded insert into the first passage through the external aperture, wherein: the first threaded insert is sized to engage interior surfaces of the first passage that surround the external aperture with a tight fit to secure the first threaded insert within the first passage at a location closer to the external aperture than the internal aperture, and with the head of the enclosure screw disposed between the first threaded insert and the aperture shoulder surrounding the internal aperture; and the first threaded insert defines a threaded third passage that extends through the first threaded insert to receive and engage an elongate threaded portion of a mounting screw inserted into the third passage from the environment external to the enclosure. The method still further includes inserting the engagement tip through the threaded third passage to engage the tool engagement formation of the enclosure screw; and with the threaded end of the enclosure screw extending through the internal aperture of the first passage of the first boss and into the second passage of the second boss, and with the engagement tip of the tool engaging the engagement formation of the head of the enclosure screw, operating the tool to cause rotation of the enclosure screw to draw together the first portion and the second portion of the enclosure to cause cooperation between at least the first portion and the second portion of the enclosure to enclose the internal volume.

Figure 1B:
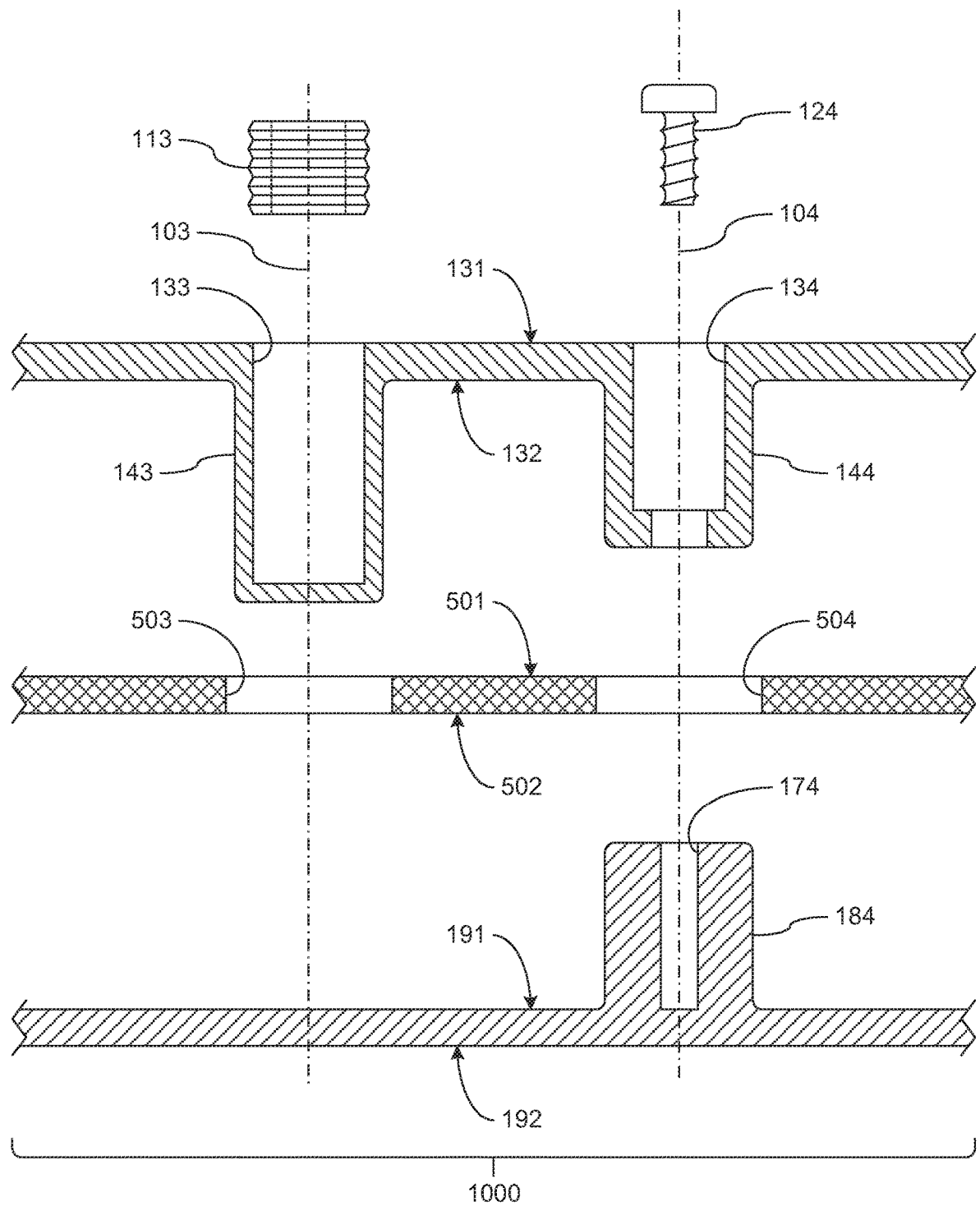
Figure 1C:
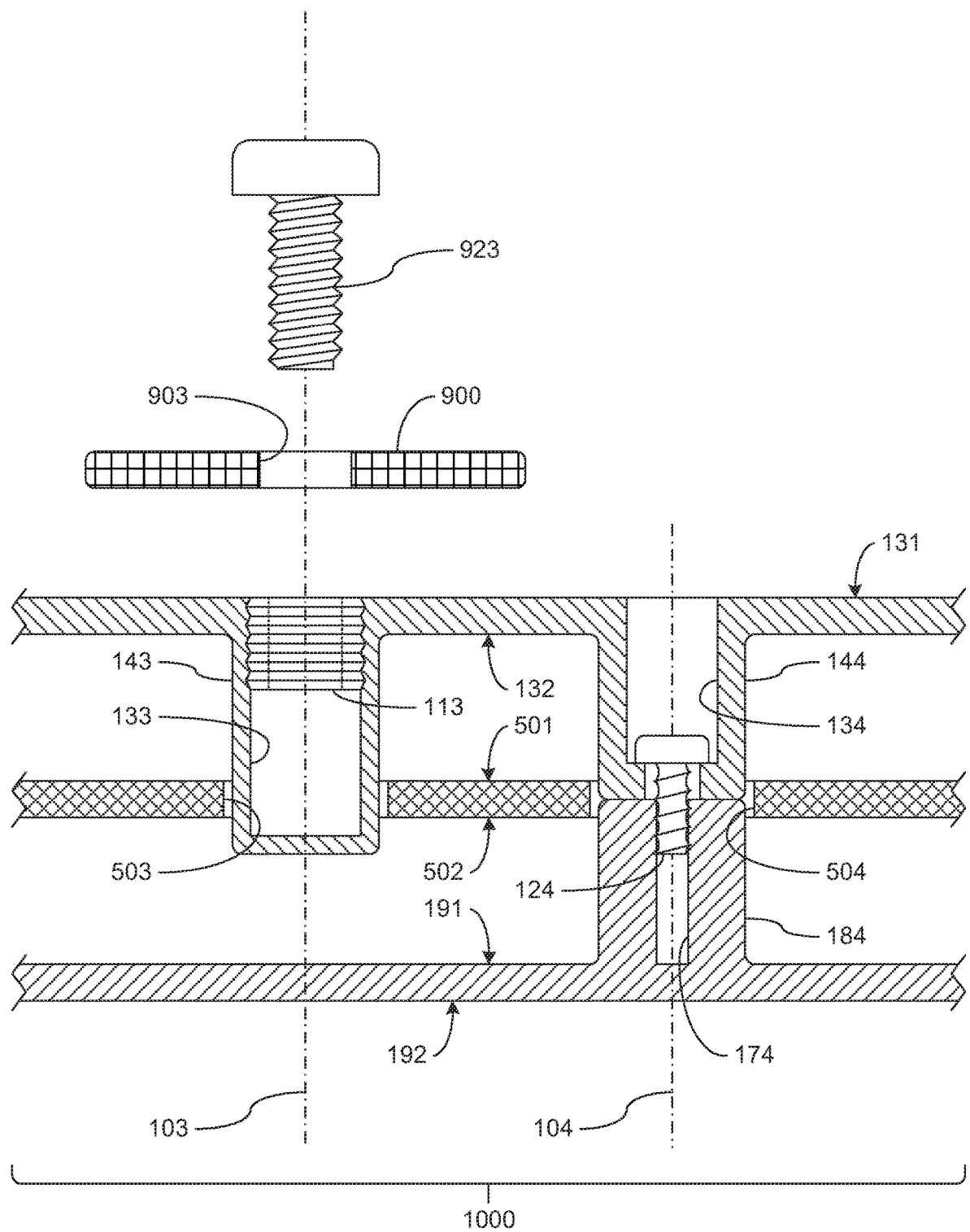

FIG. 1 depicts aspects of an enclosure 100 of a PRIOR ART electronic device 1000, such as an optical scanner, a radio frequency identification (RFID) tag reader, etc. As depicted, the enclosure 100 includes an upper enclosure portion 130, a lower enclosure portion 190, and an enclosure window portion 150 that may be formed of a transparent material to allow the passage of light therethrough, in contrast to the enclosure portions 130 and 190, which may be formed of opaque material. The enclosure 100 also includes an enclosure screw 124 for use in assembling together at least the enclosure portions 130 and 190, and a threaded insert 113 for use in affixing the completed enclosure 100 to a structure.

As also depicted, the enclosure 100 encloses a circuitboard 500 within an interior volume defined by the shapes of at least the enclosure portions 130 and 190 when at least the enclosure portions 130 and 190 are assembled. When drawn together as part of assembling the enclosure, edge portions of each of the enclosure portions 130 and 190 surround and engage corresponding edge portions of the window portion 150 to captively retain the window portion 150 therebetween, thereby cooperating with the window portion 150 to complete the assembly of the enclosure 100. The circuitboard 500 may carry an optical electronics component 550, such as one or more light emitters, and/or one or more light collecting and/or imaging capturing components. The optical electronics component 550 may also incorporate any of a variety of lens, light pipes, mirrors, etc. to optically manipulate light that is either emitted or captured by the optical electronics component 550.

Figure 2:
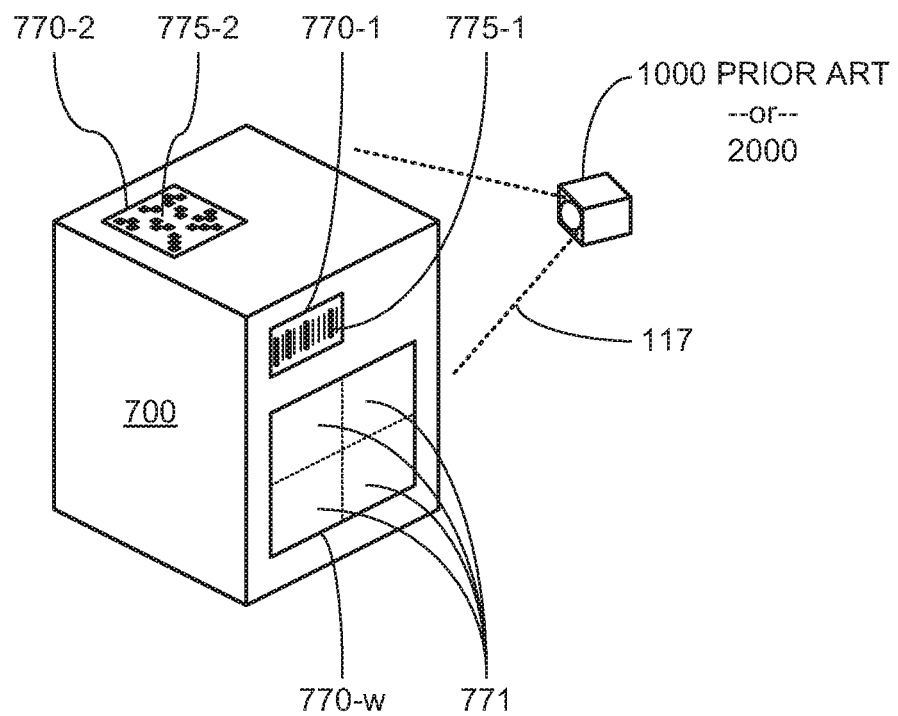
FIG. 2, shows aspects of the use of an example electronic device (e.g., an optical scanning device) employing either the prior art enclosure of FIG. 1, or one of the novel enclosures of either FIG. 3 or FIG. 4.

More specifically, and as depicted in FIG. 2, the prior art electronic device 1000 may be an optical scanner employed to scan various forms of indicia, such as the depicted example indicia 775-1, 775-2 or 775-w carried by labels 770-1, 770-2 or 770-w, respectively, adhered to various objects, such as the depicted example box object 700. It may be that such an object is placed within the field of view (FOV) 117 of the optical electronics component 550 to enable one (or more) of the indicia 775-1, 775-2 or 775-w to be scanned through the window portion 150 of the enclosure 100.

Returning to FIG. 1, the upper enclosure portion 130 may carry a mounting boss 143 and an assembly boss 144 formed integrally therewith to extend into the interior volume of the enclosure 100. The lower enclosure portion 190 may carry an assembly boss 184 that corresponds to the assembly boss 144 and that is formed integrally with the lower enclosure portion 190 to also extend into the interior volume of the enclosure 100. With at least the enclosure portions 130 and 190 assembled together, the assembly bosses 144 and 184 of the upper and lower enclosure portions 130 and 190, respectively, may extend toward and engage each other within the interior volume.

The mounting boss 143 may have a generally elongate shape that defines a passage 133 therethrough that communicates between the environment external to the enclosure 100 and the interior volume that is enclosed within the enclosure 100 when at least the enclosure portions 130 and 190 are assembled. Similarly, the assembly boss 144 may have a generally elongate shape that defines a passage 134 therethrough that similarly communicates between such an external environment and the interior volume. The assembly boss 184 may have a generally elongate shape that defines a passage 174 that may extend only partly therethrough such that the passage 174 may also open into the interior volume, but may not communicate between the interior volume and another space.

As depicted, the passages 134 and 174 may be defined and oriented by the assembly bosses 144 and 184, respectively, to align with each other along an assembly axis 104. Further, to accommodate the extension of the mounting boss 143 into the interior volume along the mounting axis 103, to accommodate the engagement between the assembly bosses 144 and 184 along the assembly axis 104, and/or to also make use of the engagement between the pair of assembly bosses 144 and 184 to secure the circuitboard 500 at a preselected position within the interior volume, corresponding cutouts 503 and 504, respectively, may be formed through the circuitboard 500. As depicted, the cutouts 503 and 504 may extend along the axes 103 and 104, respectively, and between the upper surface 501 and the lower surface 502 of the circuitboard 500.

It should be noted that, in other embodiments, the mounting boss 143 may not extend so far into the interior volume of the enclosure 100 as to actually require that the circuitboard 500 have the cutout 503 formed therethrough. However, the mounting boss 143 may still extend sufficiently far into the interior volume as to at least come close to making contact with a portion of the surface 501 of the circuitboard 500 such that no electronic components are able to mounted on that portion of the surface 501 of the circuitboard 500.

To effect assembly of the prior art electronic device 1000, the circuitboard 500 and the enclosure portions 130 and 190 may be aligned with each other such that the cutout 503 (if present as a result of the mounting boss 143 extending far enough into the interior volume) and the passage 133 are caused to be aligned along the mounting axis 103, and such that the cutout 504 and the passages 134 and 174 are caused to be aligned along the assembly axis 104. Further, the window portion 150 may be aligned with the other enclosure portions 130 and 190 to enable edge portions of the window portion 150 to be surrounded and engaged by corresponding edge portions of the other enclosure portions 130 and 190 as the enclosure portions 130, 150 and 190 are brought together so as to secure the window portion 150 in place between the other enclosure portions 130 and 190.

To further effect assembly of the prior art electronic device 1000, an assembly screw 124 may be inserted into the passage 134 of the assembly boss 144 in an orientation that causes a threaded end of a threaded shaft thereof to extend through the interior aperture of the passage 134 that opens into the interior volume, and into the passage 174 of the assembly boss 184. As depicted, the assembly screw 124 may have self-tapping threads that engage the interior surfaces of the passage 174 to cause a drawing together of at least the enclosure portions 130 and 190 when the assembly screw 124 is rotated about the assembly axis 104 through use of a tool (not shown), the tip of which may extend into the passage 134 to engage the head of the assembly screw 124 to cause such rotation.

To enable the enclosure 100 of the prior art electronic device 1000 to be affixed to structure that is external to the enclosure 100 (e.g., the depicted mounting bracket 900), a threaded insert 113 may be inserted into the passage 133 of the mounting boss 143. The threaded insert 113 may be any of a variety of widely known and used threaded inserts that defines a passage therethrough with an interior cylindrical surface that defines a set of threads to engage threads of a mounting screw (e.g., the depicted mounting screw 923) by which such affixing of the prior art electronic device 1000 may be performed.

As can be appreciated from what is shown in FIG. 1, such use of two different pairs of bosses to perform the two different functions of assembling the enclosure 100 and affixing the resulting prior art electronic device 1000 to other structure necessitates that portions of the interior volume enclosed within the enclosure 100 and portions of the surfaces 501 and 502 of the circuitboard be dedicated to making room for those two different pairs of bosses. Again, one or more cutouts may need to be formed through the circuitboard 500, and/or one or more portions of either surface 501 or 502 are rendered unusable for the mounting of electronic components. As those skilled in the art will readily recognize, the greater the quantity of bosses, the greater the portions of the interior volume, and/or of the surfaces 501 and/or 502 of the circuitboard that must be dedicated to making room for those bosses. As a result, the overall size of the circuitboard 500 may need to be increased to make up for the lost portions of the surfaces 501 and/or 502 to enable needed electronic components to be mounted thereto. Correspondingly, as the circuitboard 500 is so increased in overall size, overall size of the enclosure 100 may need to be increased to make more room for the circuitboard 500 and/or the electronic components mounted thereto.

Figure 3A:
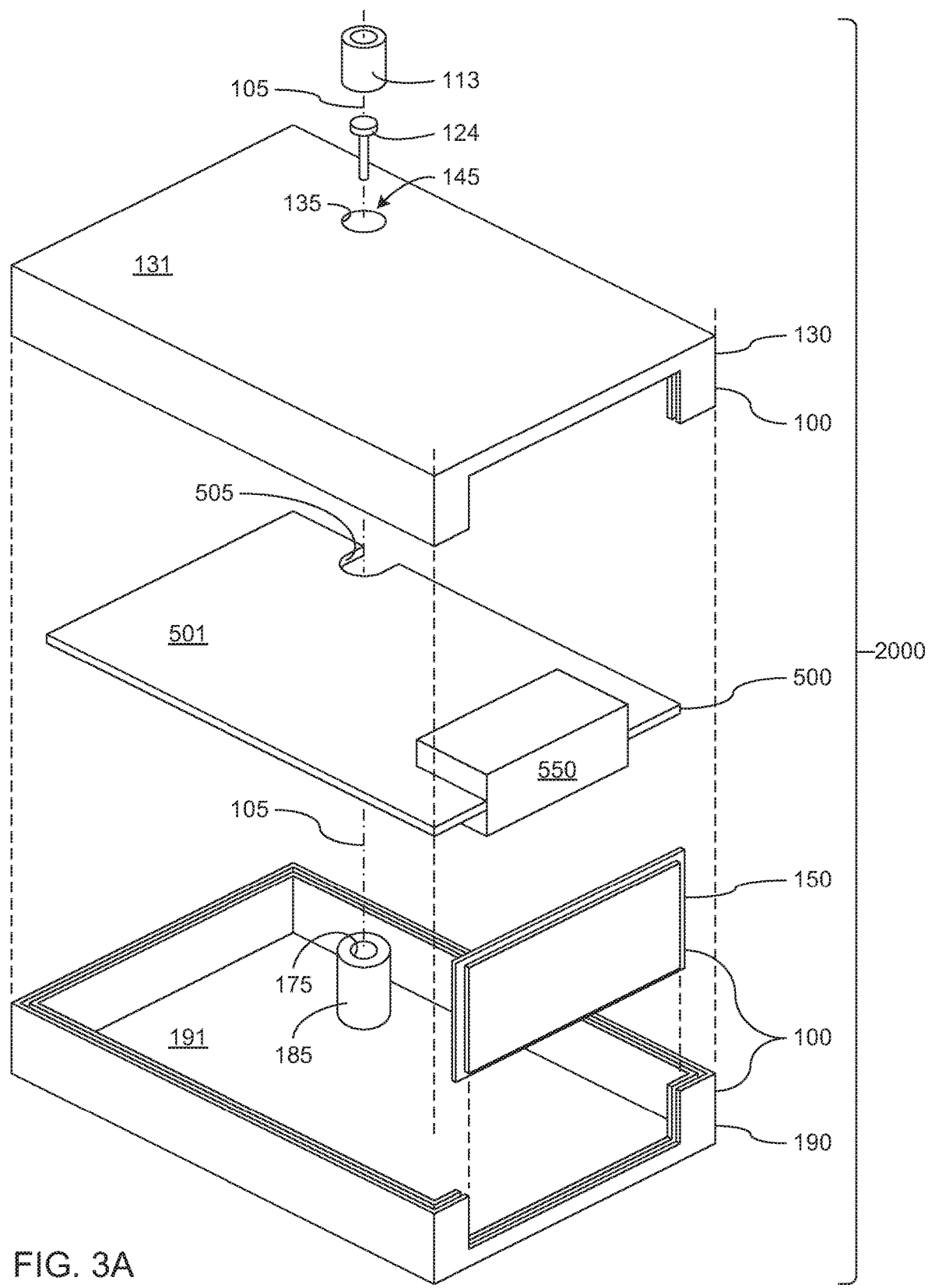
FIGS. 3A and 3B, collectively referred to herein as FIG. 3, shows aspects of an example implementation of an enclosure that improves upon the prior art.
Figure 3B:
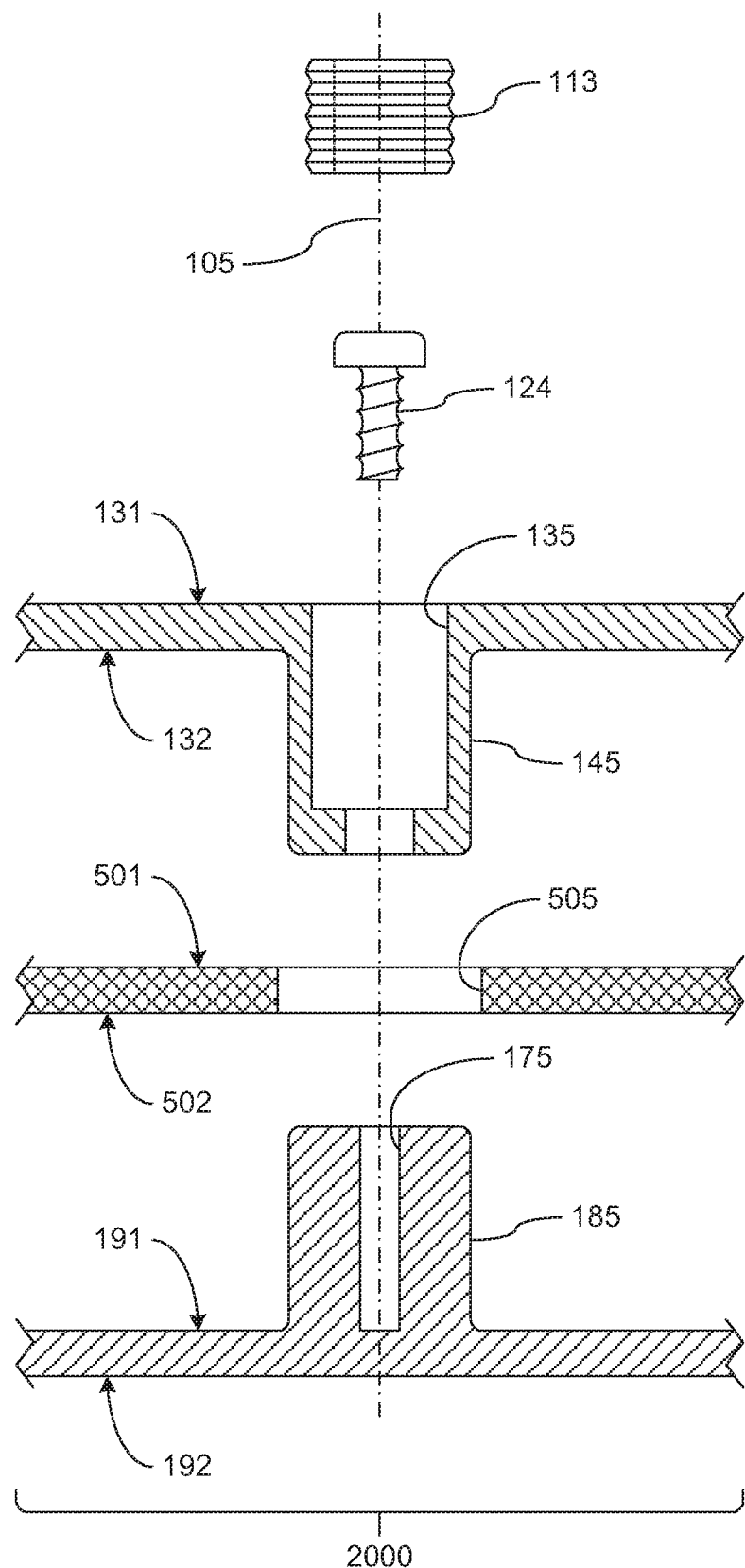
Figure 4A:
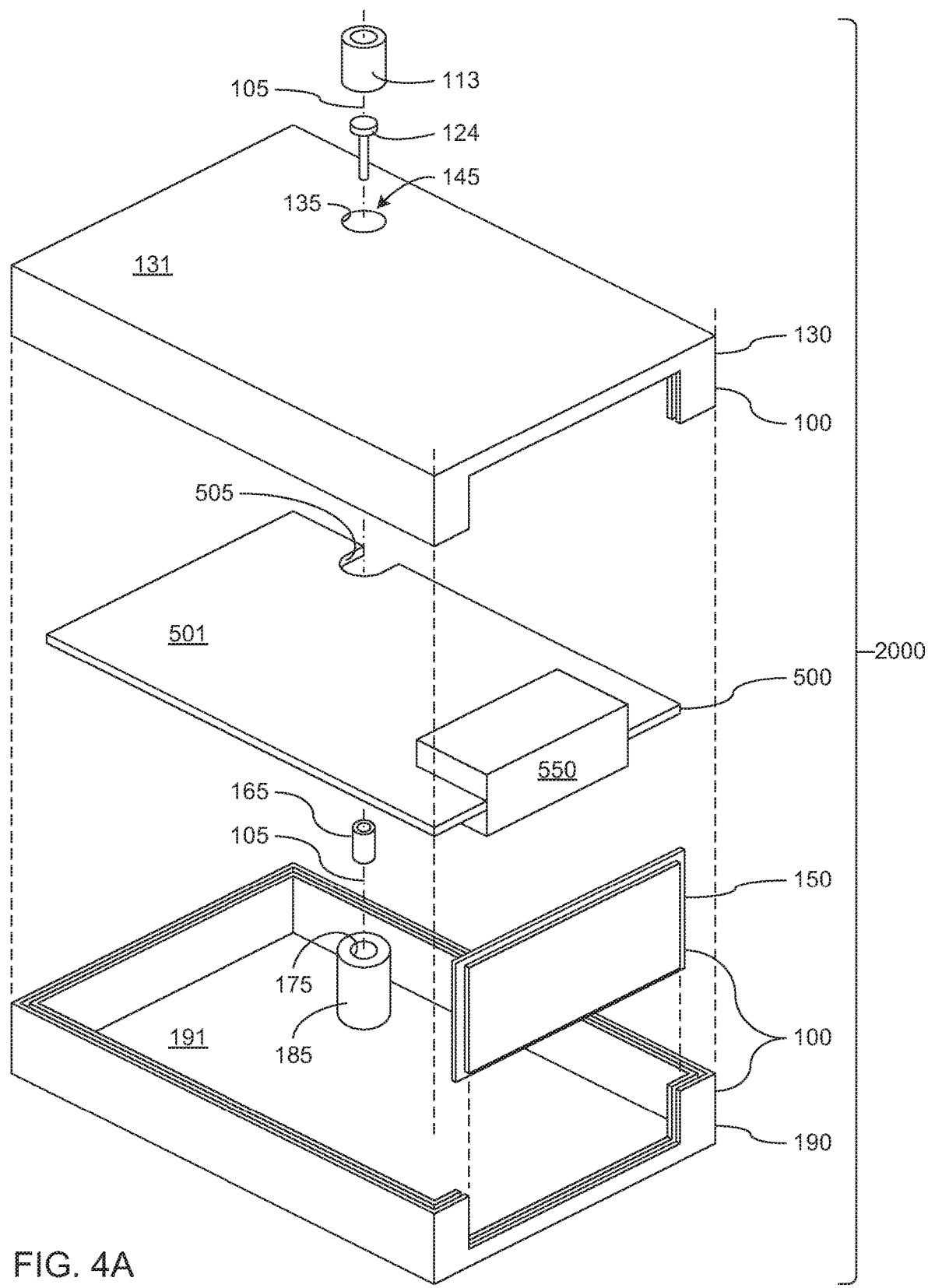
FIGS. 4A and 4B, collectively referred to herein as FIG. 4, shows aspects of an alternate example implementation of an enclosure that improves upon the prior art.
Figure 4B:
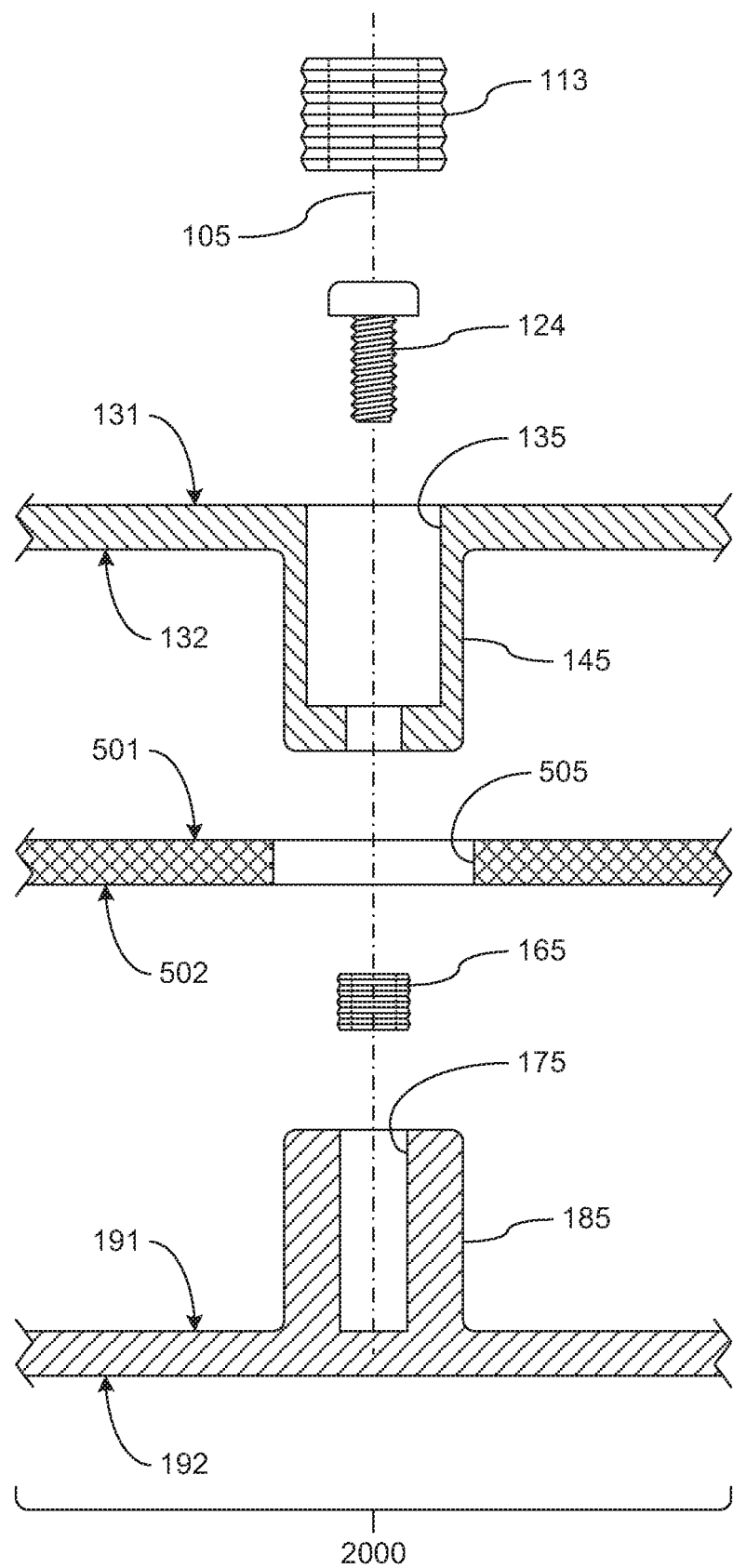

FIGS. 3 and 4 depict alternate examples of a novel multipurpose boss assembly that may be used in place of separate mounting bosses and assembly bosses to reduce the quantity of bosses that occupy portions of the interior volume of the enclosure 100, the quantity of cutouts formed through the circuitboard 500 and/or the quantity of portions of the surfaces 501 and/or 502 of the circuitboard 500 that are rendered unusable for the mounting of electronic components. More specifically, FIGS. 3 and 4 each depict aspects of an enclosure 100 of a novel electronic device 2000, such as an optical scanner, an RFID tag reader, etc., in which the enclosure 100 of FIGS. 3 and 4 is similar to the enclosure 100 of FIG. 1 in many ways, except for the bosses that are used.

Thus, the enclosure 100 of FIGS. 3 and 4 also include the upper enclosure portion 130, the lower enclosure portion 190, and the enclosure window portion 150, as well as the enclosure screw 124 and the threaded insert 113. Further the enclosure 100 of FIGS. 3 and 4 also encloses the circuitboard 500 within an interior volume defined by the shapes of at least the enclosure portions 130 and 190 when at least the enclosure portions 130 and 190 are assembled. Again, the circuitboard 500 may carry an optical electronics component 550, such as one or more light emitters, and/or one or more light collecting and/or imaging capturing components, and again, the optical electronics component 550 may incorporate any of a variety of lens, light pipes, mirrors, etc. to optically manipulate light that is either emitted or captured by the optical electronics component 550.

Thus the novel electronic device 2000 may also be an optical scanner employed to scan the depicted example indicia 775-1, 775-2 or 775-w carried by labels 770-1, 770-2 or 770-w, respectively, adhered to the depicted example box object 700 of FIG. 2. Again, it may be that such an object is placed within the FOV 117 of the optical electronics component 550 to enable one (or more) of the indicia 775-1, 775-2 or 775-w to be scanned through the window portion 150 of the enclosure 100.

Returning to FIGS. 3 and 4, the upper enclosure portion 130 of the enclosure 100 may carry a multipurpose boss 145 formed integrally therewith (instead of the separate bosses 143 and 144 of the upper enclosure portion 130 of FIG. 1) to extend into the interior volume of the enclosure 100. Similarly, the lower enclosure portion 190 may carry a corresponding boss 185 formed integrally therewith to also extend into the interior volume of the enclosure 100. With at least the enclosure portions 130 and 190 assembled together, the bosses 145 and 185 of the upper and lower enclosure portions 130 and 190, respectively, may extend toward and engage each other within the interior volume.

The multipurpose boss 145 may have a generally elongate shape that defines a passage 135 therethrough that communicates between the environment external to the enclosure 100 and the interior volume that is enclosed within the enclosure 100 when at least the enclosure portions 130 and 190 are assembled. More precisely, the passage 135 emerges into such an external environment through an external aperture formed through the outer surface 131 of the upper enclosure portion 130. The boss 185 may have a generally elongate shape that defines a passage 175 that may extend only partly therethrough such that the passage 175 may open into the interior volume, but may not communicate between the interior volume and another space. As depicted in FIG. 4, the boss 185 may additionally carry a threaded insert 165 within the passage 175.

Continuing with both FIGS. 3 and 4, as depicted, the passages 135 and 175 may be defined and oriented by the multipurpose boss 145 and the boss 185, respectively, to align with each other along a multipurpose axis 105. Further, to accommodate the engagements between the bosses 145 and 185 along the axis 105, and to also make use of this engaging pair of bosses to secure the circuitboard 500 at a preselected position within the interior volume, a corresponding cutout 505 may be formed through the circuitboard 500. As depicted, the cutout 505 may extend along the multipurpose axis 105, and between the upper surface 501 and the lower surface 502 of the circuitboard 500.

To effect assembly of the novel electronic device 2000, the circuitboard 500 and the enclosure portions 130 and 190 may be aligned with each other such that the cutout 505 and the passages 135 and 175 are caused to align along the multipurpose axis 105. Further, the window portion 150 may be aligned with the other enclosure portions 130 and 190 to enable edge portions of the window portion 150 to be surrounded and engaged by corresponding edge portions of the other enclosure portions 130 and 190 as the enclosure portions 130, 150 and 190 are brought together so as to secure the window portion 150 in place between the other enclosure portions 130 and 190.

To further effect assembly of the prior art electronic device 1000, the assembly screw 124 may be inserted into the passage 135 of the multipurpose boss 145 in an orientation that causes the threaded end of the threaded shaft thereof to extend through the interior aperture of the passage 135 that opens into the interior volume, and into the passage 175 of the corresponding boss 185. As depicted in FIG. 3, the assembly screw 124 may have self-tapping threads that engage the interior surfaces of the passage 175 to cause a drawing together of at least the enclosure portions 130 and 190 when the assembly screw 124 is rotated about the assembly axis 105 through use of a tool (not shown), the tip of which may extend into the passage 135 to engage the head of the assembly screw 125 to cause such rotation.

Alternatively, as depicted in FIG. 4, the assembly screw 124 may have machine threads that engage corresponding machine threads carried within a passage that extends through the threaded insert 165 that is carried within the passage 175, and this engagement between machine threads may cause the drawing together of at least the enclosure portions 130 and 190 when the assembly screw 124 is rotated about the assembly axis 105. Thus, in preparation for assembly of the enclosure 100 of the novel electronic device 2000 of FIG. 4, the threaded insert 165 must have been earlier inserted into the passage 175 of the boss 185. Like the threaded insert 113, the threaded insert 165 may be any of a variety of widely known and used threaded inserts that defines a passage therethrough within an interior cylindrical surface that defines a set of machine threads to engage the machine threads of the machine screw variant of the assembly screw 124 of FIG. 4.

Returning to both FIGS. 3 and 4, to enable the enclosure 100 of the novel electronic device 2000 to be affixed to structure (not shown) that is external to the enclosure 100, the threaded insert 113 may be inserted into the passage 135 of the multipurpose boss 145.

As can be appreciated from what is shown in FIGS. 3 and 4, such use of a single pair of bosses to perform the two different functions of assembling the enclosure 100 and affixing the resulting prior art electronic device 1000 to other structure reduces the portion of the interior volume enclosed within the enclosure 100 and the portions of the surfaces 501 and 502 of the circuitboard that must be dedicated to making room for pairs of bosses. Therefore, in comparison to the circuitboard 500 of the prior art electronic device 1000 of FIG. 1, the circuitboard 500 of the novel electronic device 2000 of either FIG. 3 or FIG. 4 may be made with an overall smaller size such that the enclosure 100 of either FIG. 3 or FIG. 4 may also be made to have an overall smaller size.

Figure 5A:
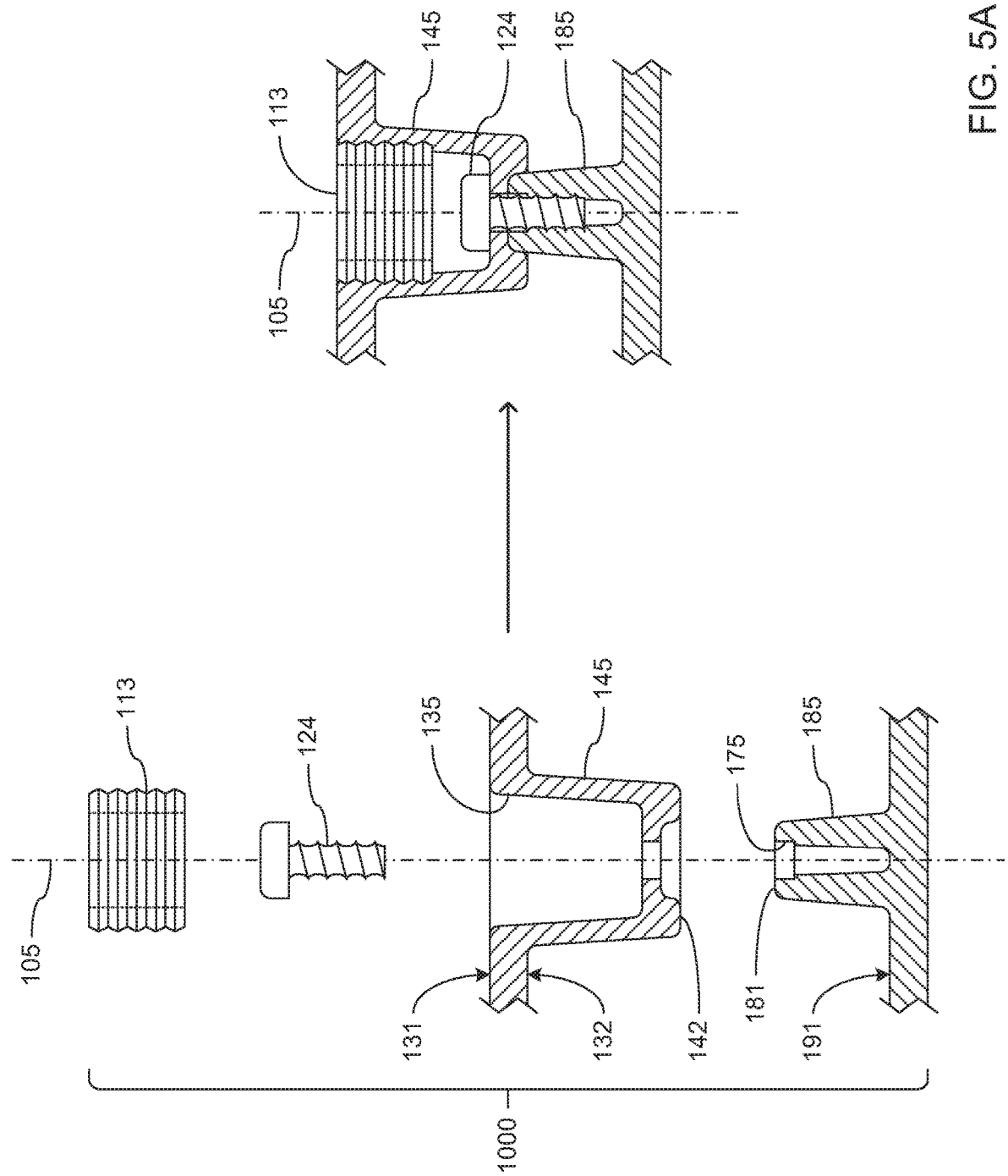
Figure 5B:
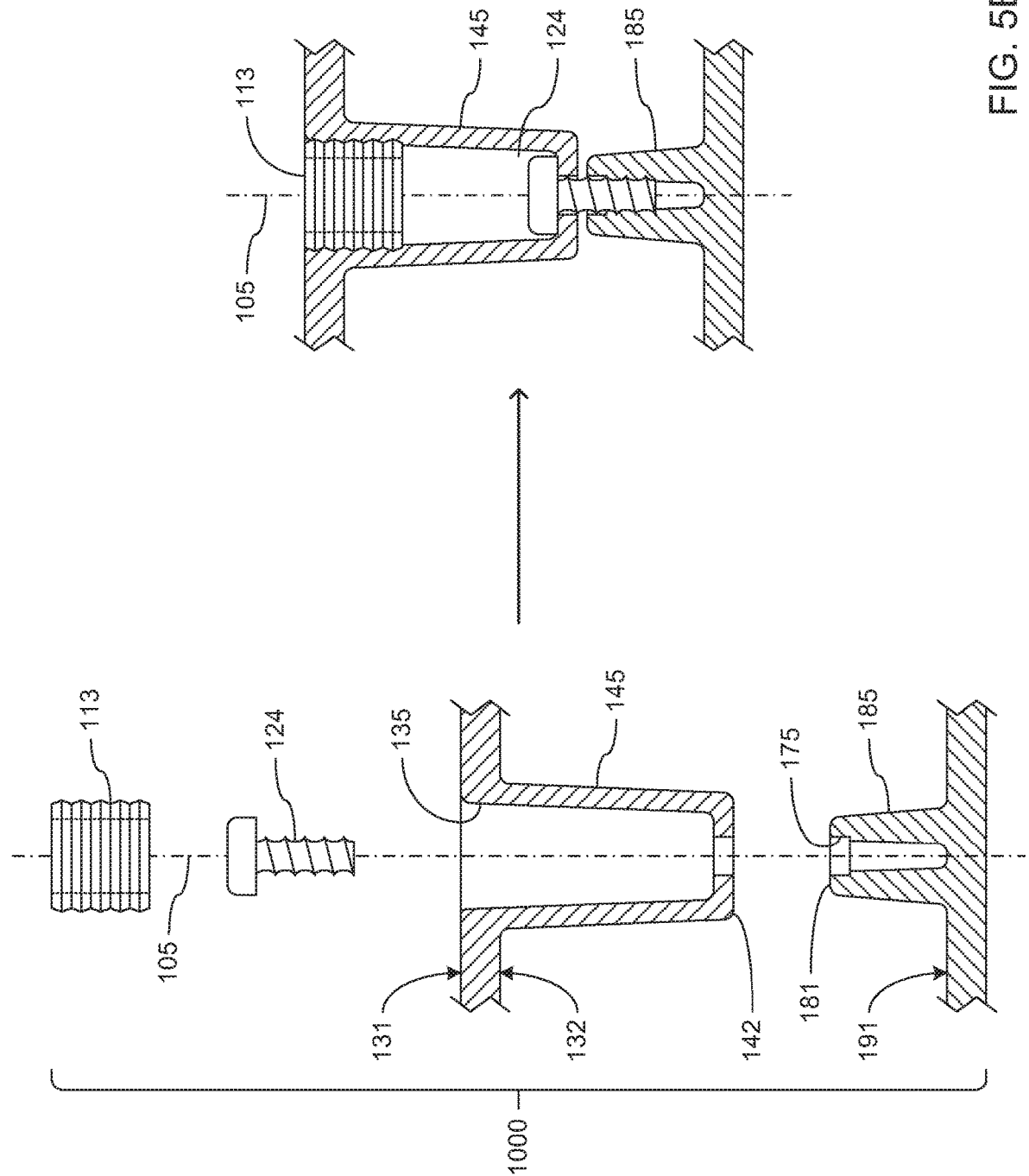
Figure 5D:
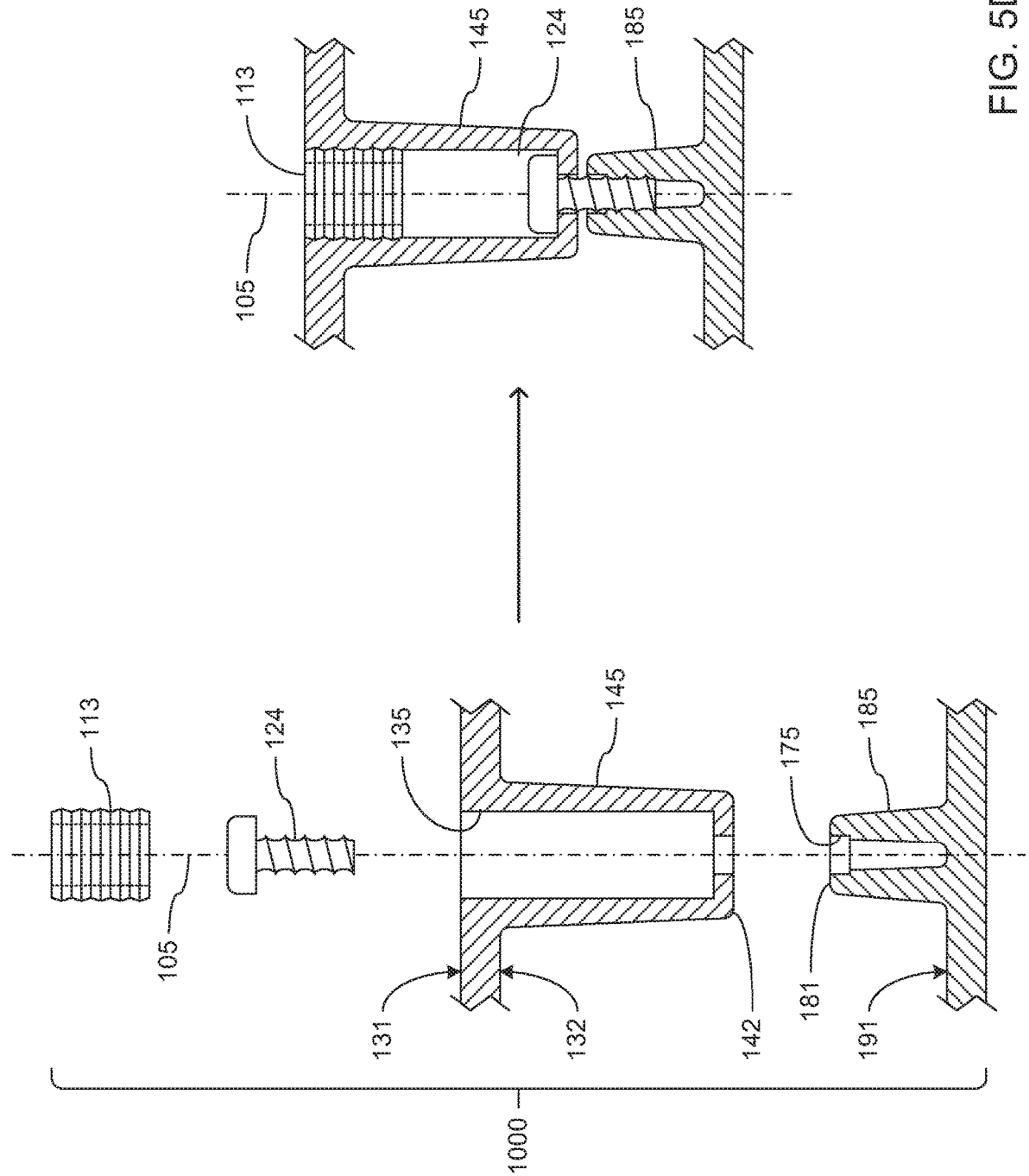
Figure 6A:
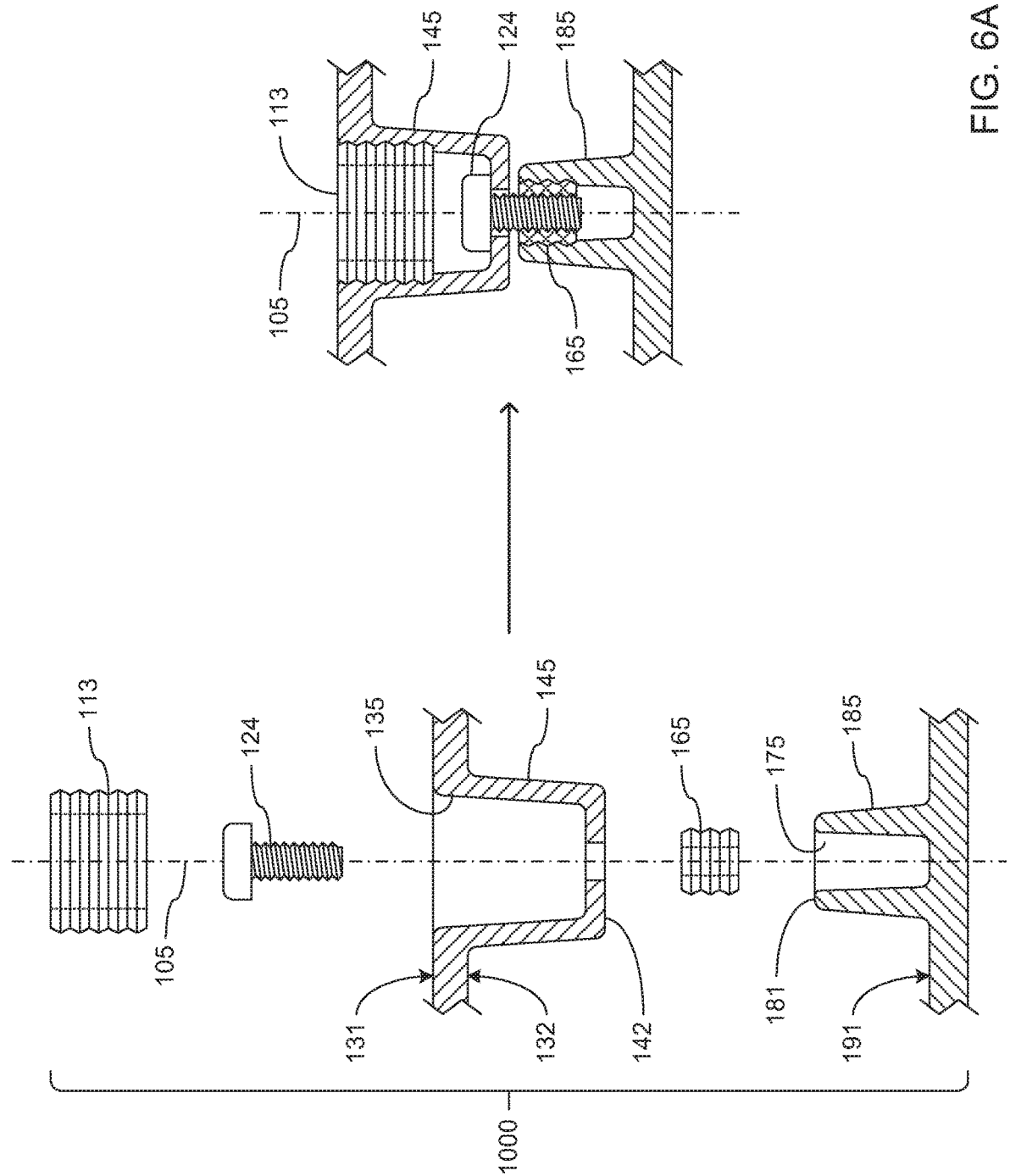
Figure 6B:
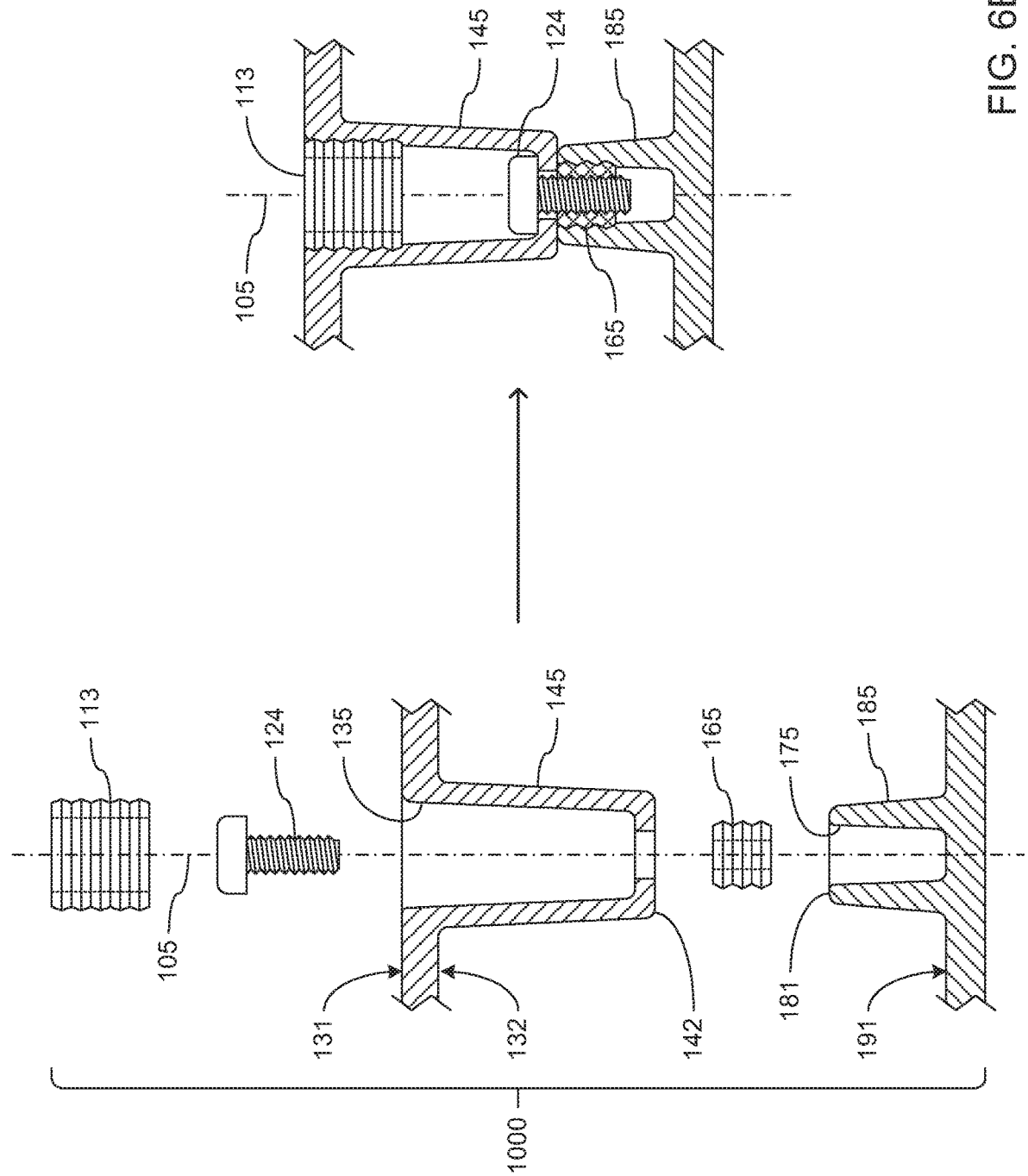
Figure 6C:
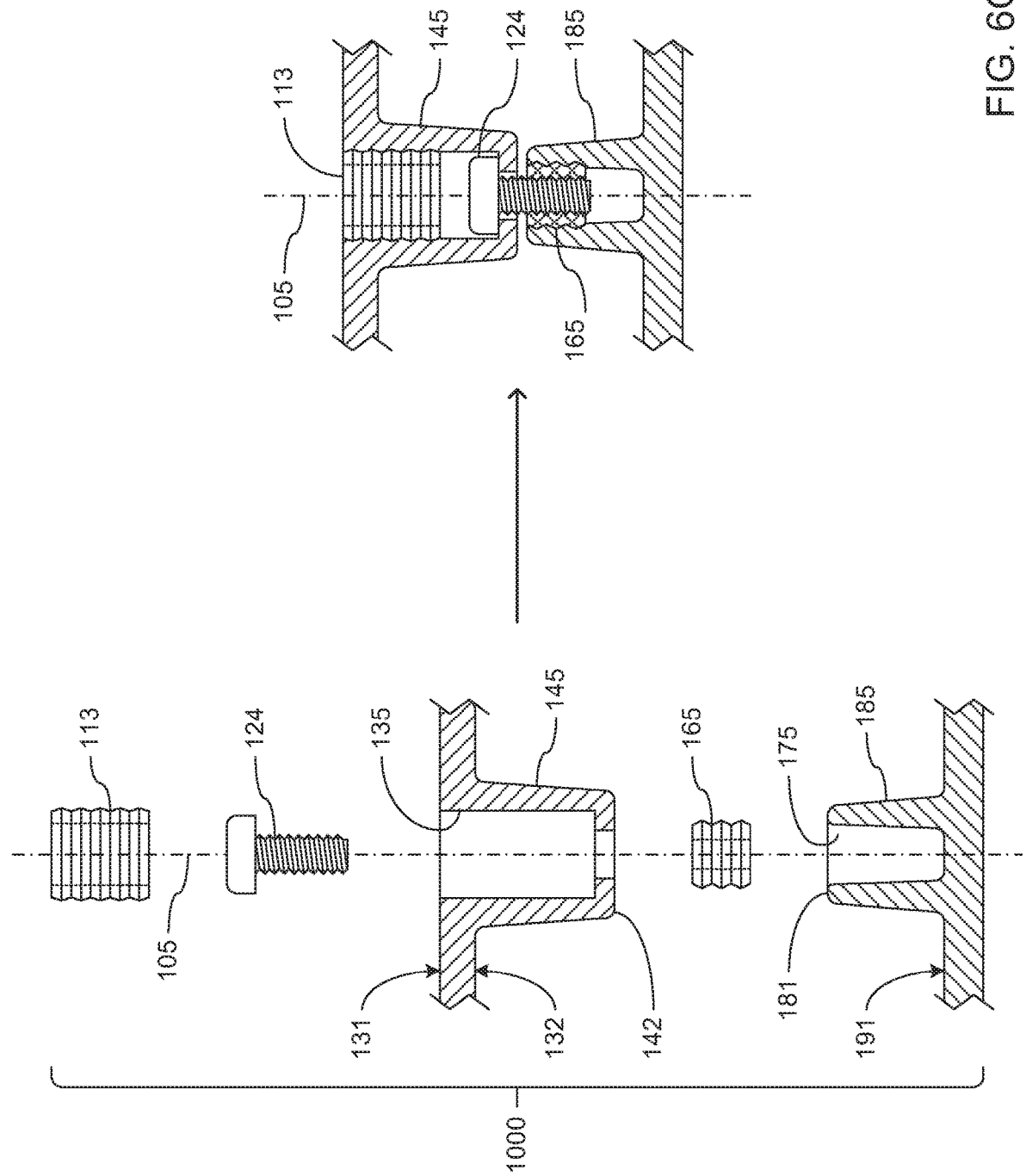

FIGS. 5 and 6 depict multiple differing examples of a novel multipurpose boss assembly in greater detail. More specifically, each of the FIGS. 5A through 5D of FIG. 5 depicts a different example of the multipurpose boss 145 employed in the enclosure 100 of FIG. 3 in greater detail, and each of the FIGS. 6A through 6D of FIG. 6 depicts a different example of the multipurpose boss 145 employed in the enclosure 100 of FIG. 4 in greater detail. It should be noted that each of FIGS. 5A-D and 6A-D provide side-by-side partially sectional views of a multipurpose boss assembly prior to being assembled, and then as fully assembled as part of assembling the enclosure 100.

Turning to FIG. 5A, the external shape of the depicted example of multipurpose boss 145 may taper slightly as it extends into the interior volume from the inner surface 132 of the upper enclosure portion 130. Similarly, the external shape of the corresponding boss 185 may also taper slightly as it extends into the interior volume from the inner surface 191 of the lower enclosure portion 190. As will be familiar to those skilled in the art, such tapering of such physical features may be deemed desirable and/or necessary where the enclosure 100 is formed in a mold (e.g., molded from a thermoplastic) to enable release from the mold. Correspondingly, the passage 135 tapers slightly as it extends from the external aperture where the passage 135 emerges into the external environment through the outer surface 131 of the upper enclosure portion 130, and towards the internal aperture where the passage 135 opens into the interior volume through an engagement surface 142. Similarly, the passage 175 tapers slightly as it extends from its innermost end within the boss 185, and towards the aperture where the passage 175 opens into the interior volume through a corresponding engagement surface 181.

As depicted, the internal aperture through which the passage 135 opens through the engagement surface 142 and into the interior volume may be even more constricted in its size than the external aperture to a greater degree than is caused by the tapering. This may be done to provide an annular shoulder about the internal aperture within the passage 135 that is to be engaged by the annular shoulder defined by the enlarged size of the head of the assembly screw 124 in comparison to its elongate threaded shaft. Such engagement between these two annular shoulders may serve to retain the head of the assembly screw 124 within the passage 135 even as the threaded shaft thereof extends through the internal aperture formed through the engagement surface 142 and toward the passage 175 of the corresponding boss 185.

As also depicted, the multipurpose boss 145 may be molded to give the engagement surface 142 a concave or indented portion within which the smaller sized engagement surface 181 of the corresponding boss 185 may be received. This may be done as a further aid to aligning the passages 135 and 175 along the multipurpose axis 105 as the enclosure portions 130 and 190 are brought together as part of assembling the enclosure 100.

As further depicted, the width (e.g., the diameter) of the passage 135 (e.g., at the location of the external aperture where the passage 135 emerges through the outer surface 131) may be selected to enable the insertion of a variant of the threaded insert 113 that is selected to be sufficiently large as to have a threaded passage formed therethrough that is, itself, sufficiently large as to allow the head of the assembly screw 124 to pass therethrough. Thus, unlike other examples of the multipurpose boss assembly depicted and described elsewhere herein, it may not be necessary to insert the assembly screw 124 into the passage 135 prior to inserting the threaded insert 113 therein. Stated differently, the selection and use of such a large variant of the threaded insert 113 may permit its insertion into (as well as its securing within) the passage 135 at a time prior to the insertion of the assembly screw 124 into the passage 135 and partially through the inner aperture formed through the engagement surface 142. The use of such a larger threaded insert 113 may be deemed desirable to provide some degree of flexibility as to how far the assembly screw 124 is inserted into the passage 135. By way of example, during assembly of the electronic device 2000, there may be an assembly step in which it may be desirable to insert the assembly screw 124 only part way through the passage 135 with the head of the assembly screw 124 kept within the threaded insert 113 and with the threaded end of the assembly screw 124 not yet extending through the interior aperture at the engagement surface 124. The use of such a larger threaded insert 113 may also be deemed desirable where there is at least some possibility of a need to subsequently replace the assembly screw 124 with a different assembly screw (e.g., another assembly screw of different length and/or different type of thread).

Regardless of the sizes of the threaded insert 113 and/or of any particular portion of the passage 135, any of a variety of techniques may be employed to secure the threaded insert 113 within the passage 135. By way of example, the relative sizes of the threaded insert 113 and of the passage 135 may be selected to enable the threaded insert 113 to simply be pressed into the passage 135, while achieving a tight enough fit as to be secured therein without further steps. Alternatively, any of a variety of welding, heating, chemical bonding, adhesive, threading and/or other techniques may be used to secure the threaded insert 113 within the passage 135.

Turning to FIG. 5B, the depicted example multipurpose boss 145 of FIG. 5B is substantially similar to that of FIG.

5A, although the multipurpose boss 145 of FIG. 5B is narrower and more elongated. Like the multipurpose boss 145 of FIG. 5A, the external shape of the multipurpose boss 145 of FIG. 5B also tapers slightly as it extends into the interior volume from the inner surface 132 of the upper enclosure portion 130, as does the external shape of the corresponding boss 185 as it extends into the interior volume from the inner surface 191 of the lower enclosure portion 190. Correspondingly, the passage 135 also tapers slightly as it extends from the external aperture where the passage 135 emerges into the external environment through the outer surface 131 and towards the internal aperture where the passage 135 opens into the interior volume through an engagement surface 142, as does the passage 175 as it extends from its innermost end within the boss 185 and towards the aperture where the passage 175 opens into the interior volume through the corresponding engagement surface 181.

Again, the internal aperture through which the passage 135 opens through the engagement surface 142 and into the interior volume may be even more constricted in its size to engage and retain the enlarged head of the assembly screw 124 within the passage 135. However, unlike the engagement surface 142 of FIG. 5A, the engagement surface 142 of FIG. 5B does not have a concave or indented portion within which the smaller sized engagement surface 181 of the corresponding boss 185 may be received. Instead, the engagement surface 142 of FIG. 5B is substantially flat. As additionally depicted in FIG. 5B, there may be embodiments of the electronic device 2000 in which the engagement surfaces 142 and 181 of the pair of multipurpose bosses 145 and 185 may not actually come into contact with each other when the enclosure 100 is assembled. This may be deemed desirable as an aid to ensuring that the outer edges of the enclosure portions 130 and 190 come together and fully engage each other.

Also unlike the multipurpose boss 145 of FIG. 5A, the narrower dimension of the multipurpose boss 145 of FIG. 5B may result in the passage 135 being sufficiently narrower as to preclude the use of a variant of the threaded insert 113 that is sufficiently large as to provide a threaded passage that enables the head of the assembly screw 124 to pass therethrough. Thus, unlike the multipurpose boss 145 of FIG. 5A, the assembly screw 124 must be inserted into the passage 135 of the multipurpose boss 145 of FIG. 5B before the threaded insert 113 is inserted therein. However, the more elongated shape of the multipurpose boss 145 of FIG. 5B results in the passage 135 also being more elongated such that it may be possible for the assembly screw 124 to be retained within the passage 135 at a location therein that does not cause the threaded end thereof to extend through the interior aperture formed through the engagement surface 142.

Again, regardless of the sizes of the threaded insert 113 and/or of any particular portion of the passage 135, any of a variety of techniques may be employed to secure the threaded insert 113 within the passage 135.

Turning to FIG. 5C, the depicted example multipurpose boss 145 of FIG. 5C is substantially similar to that of FIG. 5B, although the multipurpose boss 145 of FIG. 5B is not as elongated. Like the multipurpose boss 145 of FIGS. 5A and 5B, the external shape of the multipurpose boss 145 of FIG. 5C also tapers slightly as it extends into the interior volume from the inner surface 132 of the upper enclosure portion 130, as does the external shape of the corresponding boss 185 as it extends into the interior volume from the inner surface 191 of the lower enclosure portion 190. However, while the passage 175 of the boss 185 also tapers, the passage 135 may be created by boring at least partially into the multipurpose boss 145 such that the passage 135 does not taper. Such use of boring, instead of simply molding the passage 135, such that the passage 135 does not taper may be deemed desirable to avoid causing the passage 135 to widen as a result of such tapering. This may enable the use of a still smaller variant of the threaded insert 113, while avoiding the need to use a correspondingly smaller assembly screw 124.

Again, the internal aperture through which the passage 135 opens through the engagement surface 142 and into the interior volume may be even more constricted in its size to engage and retain the enlarged head of the assembly screw 124 within the passage 135. Also, like the engagement surface 142 of FIG. 5A, the engagement surface 142 of FIG. 5C may be formed to have a concave or indented portion within which the smaller sized engagement surface 181 of the corresponding boss 185 may be received.

Like the passage 135 of the multipurpose boss 145 of FIG. 5B, the still narrower dimension of the passage 135 of the multipurpose boss 145 of FIG. 5C results in the passage 135 being sufficiently narrower as to require the use of a variant of the threaded insert 113 through which the head of the assembly screw 124 is not able to pass. However, unlike the more elongated passage 135 of the multipurpose boss 145 of FIG. 5B, the less elongated shape of the multipurpose boss 145 of FIG. 5C results in its passage 135 also being less elongated such that it may not be possible for the assembly screw 124 to be retained entirely within the passage 135 such that at least a portion of the threaded end of the assembly screw 124 may be required to extend through the internal aperture formed through the engagement surface 142.

Again, regardless of the sizes of the threaded insert 113 and/or of any particular portion of the passage 135, any of a variety of techniques may be employed to secure the threaded insert 113 within the passage 135.

Turning to FIG. 5D, the depicted example multipurpose boss 145 of FIG. 5D is substantially similar to that of FIG. 5C, including the formation of the passage 135 by boring, although the multipurpose boss 145 of FIG. 5D is more elongated. Like the multipurpose boss 145 of FIGS. 5A-C, the external shape of the multipurpose boss 145 of FIG. 5C also tapers slightly as it extends into the interior volume from the inner surface 132 of the upper enclosure portion 130, as does the external shape of the corresponding boss 185 as it extends into the interior volume from the inner surface 191 of the lower enclosure portion 190. Also, the passage 175 of the boss 185 may taper, while the passage 135 may be created by boring at least partially into the multipurpose boss 145.

Again, the internal aperture through which the passage 135 opens through the engagement surface 142 and into the interior volume may be even more constricted in its size to engage and retain the enlarged head of the assembly screw 124 within the passage 135. Also again, like the engagement surface 142 of FIG. 5B, the engagement surface 142 of FIG. 5D may be formed to not have a concave or indented portion.

Like the passage 135 of the multipurpose boss 145 of FIG. 5C, the still narrower dimension of the passage 135 of the multipurpose boss 145 of FIG. 5D results in the passage 135 being sufficiently narrower as to require the use of a variant of the threaded insert 113 through which the head of the assembly screw 124 is not able to pass. However, unlike the more elongated passage 135 of the multipurpose boss 145 of FIG. 5C, the more elongated shape of the multipurpose boss 145 of FIG. 5D results in its passage 135 also being more elongated such that it may be possible for the assembly screw 124 to be retained entirely within the passage 135 such that no portion of the threaded end of the assembly screw 124 may be required to extend through the internal aperture formed through the engagement surface 142.

Again, regardless of the sizes of the threaded insert 113 and/or of any particular portion of the passage 135, any of a variety of techniques may be employed to secure the threaded insert 113 within the passage 135.

Turning to FIGS. 6A through 6D, the depicted example of multipurpose boss assembly in FIG. 6A is substantially similar to that depicted in FIG. 5A, the depicted example of multipurpose boss assembly in FIG. 6B is substantially similar to that depicted in FIG. 5B, the depicted example of multipurpose boss assembly in FIG. 6C is substantially similar to that depicted in FIG. 5C, and the depicted example of multipurpose boss assembly in FIG. 6D is substantially similar to that depicted in FIG. 5D. The one substantial difference between what is depicted in each of FIGS. 6A through 6D and what is depicted in corresponding ones of FIGS. 5A through 5D is the incorporation of the threaded insert 165 into the corresponding boss 185, and the use of a machine screw variant of the assembly screw 124.

As a result, the passage 175 of the corresponding boss 185 in each of FIGS. 6A through 6D is wider (e.g., of a wider diameter) such that the corresponding boss 185 in each of FIGS. 6A through 6D is also wider. Also as a result, the engagement surface 142 of the multipurpose boss 145 in each of FIGS. 6A through 6D is depicted as not being formed to include a concave or indented portion.

Additionally, in a manner similar to a subset of FIGS. 5A through 5D (specifically, FIGS. 5B and 5D), a subset of FIGS. 6A through 6D (specifically, FIGS. 6A and 6C) depict embodiments in which the engagement surfaces 142 and 181 of the multipurpose bosses 145 and 185, respectively, do not actually come into contact with each other when the enclosure 100 of these particular depicted embodiments of the novel electronic device 2000 are assembled.

Like the threaded insert 113 within the passage 135, the threaded insert 165 may be secured within the passage 175 using any of a variety of techniques.

There is thus disclosed a multipurpose boss assembly. A boss assembly includes a first boss formed integrally with a first portion of an enclosure, wherein: the first portion of the enclosure cooperates with at least a second portion of the enclosure to at least partly enclose an interior volume; the first boss defines a first passage that extends through the first boss; and the first passage defines an external aperture where the first passage opens into an environment external to the enclosure through an external surface of the first portion of the enclosure, and an internal aperture where the first passage opens into the interior volume. The boss assembly also includes an enclosure screw having an elongate threaded shaft portion and a head formed at a head end of the threaded shaft portion, wherein: the enclosure screw is inserted into the first passage in an orientation that causes the head to extend toward the external aperture, and that causes a threaded end of the threaded shaft portion that is opposite the head end to extend through the internal aperture, into the interior volume and toward a second passage defined by a second boss of the second portion of the enclosure; and the head is enlarged relative to the head end of the threaded shaft portion to provide an annular screw shoulder to engage an annular aperture shoulder within the first passage that surrounds the internal aperture to retain the head end of the enclosure screw within the first passage. The boss assembly further includes a first threaded insert that is sized to engage interior surfaces of the first passage with a tight fit when inserted into the first passage, wherein: the first threaded insert is secured within the first passage at a location closer to the external aperture than the internal aperture, and with the head of the enclosure screw disposed between the first threaded insert and the aperture shoulder surrounding the internal aperture; and the first threaded insert defines a threaded third passage that extends through the first threaded insert.

The third passage may be configured to enable a tip of a tool to extend therethrough to engage the head of the enclosure screw to rotate the enclosure screw within the first passage, and the third passage may be configured to receive and engage an elongate threaded portion of a mounting screw inserted into the third passage from the environment external to the enclosure.

The head of the enclosure screw may carry a tool engagement formation to enable the enclosure screw to be engaged with a screw engagement formation carried by the tip of the tool to enable use of the tool to rotate the enclosure screw within the first passage to cause the threaded end of the enclosure screw to engage interior surfaces of the second passage to draw together the first and second portions of the enclosure to enclose the interior volume.

The threaded end of the enclosure screw may carry a self-tapping thread that enables the threaded end of the enclosure screw to tap its way into the second passage of the second boss when extended through the internal aperture of the first passage of the first boss and into the second passage of the second boss, and rotated via the tool.

The boss assembly may further include the second boss.

The threaded end of the enclosure screw may carry a machine thread. The second boss may carry a second threaded insert that defines a threaded fourth passage to receive and engage the machine thread of the threaded end of the enclosure screw when the threaded end of the enclosure screw is extended through the internal aperture of the first passage of the first boss and into the threaded fourth passage of the second thread insert, and rotated via the tool.

The boss assembly may further include the second boss and the second threaded insert.

The threaded third passage may have a diameter large enough to enable the head of the enclosure screw to pass therethrough such that the first threaded insert may be inserted into and secured within the first passage before the enclosure screw is inserted into and positioned within the first passage in an orientation that causes the head to extend toward the external aperture, and that causes the threaded end of the threaded shaft to extend through the internal aperture and into the enclosed volume.

The head of the enclosure screw may have a diameter that is too large to pass through the threaded third passage such that the first threaded insert must be inserted into and secured within the first passage after the enclosure screw is inserted into the first passage to enable the enclosure screw to be positioned within the first passage in an orientation that causes the head to extend toward the external aperture, and that causes the threaded end of the threaded shaft to extend through the internal aperture and into the enclosed volume.

The first boss and the second boss may extend into the interior volume, the internal aperture of the first passage may open through a first engagement surface of the first boss, and the second passage may open through a second engagement surface of the second boss. A selected one of the first engagement surface and the second engagement surface may include a concave formation to receive and engage the non-selected one of the first engagement surface and the second engagement surface in a manner that acts to align the first passage and the second passage to better enable the threaded end of the enclosure screw to extend from the internal aperture of the first passage and into the second passage.

The first boss may be integrated into a wall of the first portion of the enclosure.

An enclosure to enclose an interior volume includes a first portion of the enclosure that includes a first boss formed integrally therewith, wherein: the first boss defines a first passage that extends through the first boss; and the first passage defines an external aperture where the first passage opens into an environment external to the enclosure through an external surface of the first portion of the enclosure, and an internal aperture where the first passage opens into an interior volume. The enclosure also includes a second portion of the enclosure that includes a second boss formed integrally therewith, wherein: the second portion of the enclosure cooperates with at least the first portion of the enclosure to at least partly enclose the interior volume; the second boss defines a second passage that extends at least partially through the second boss; and the second passage opens into the interior volume. The enclosure further includes an enclosure screw having an elongate threaded shaft portion and a head formed at a head end of the threaded shaft portion, wherein: the enclosure screw is inserted into the first passage in an orientation that causes the head to extend toward the external aperture, and that causes a threaded end of the threaded shaft portion that is opposite the head end to extend through the internal aperture, into the interior volume and toward the second passage of the second boss; and the head is enlarged relative to the head end of the threaded shaft portion to provide an annular screw shoulder to engage an annular aperture shoulder within the first passage that surrounds the internal aperture to retain the head end of the enclosure screw within the first passage. The enclosure still further includes a first threaded insert that is sized to engage interior surfaces of the first passage with a tight fit when inserted into the first passage, wherein: the first threaded insert is secured within the first passage at a location closer to the external aperture than the internal aperture, and with the head of the enclosure screw disposed between the first threaded insert and the aperture shoulder surrounding the internal aperture; and the first threaded insert defines a threaded third passage that extends through the first threaded insert.

The third passage may be configured to enable a tip of a tool to extend therethrough to engage the head of the enclosure screw to rotate the enclosure screw within the first passage, and the third passage may be configured to receive and engage an elongate threaded portion of a mounting screw inserted into the third passage from the environment external to the enclosure.

The head of the enclosure screw may carry a tool engagement formation to enable the enclosure screw to be engaged with a screw engagement formation carried by the tip of the tool to enable use of the tool to rotate the enclosure screw within the first passage to cause the threaded end of the enclosure screw to engage interior surfaces of the second passage to draw together the first and second portions of the enclosure to enclose the interior volume.

The threaded end of the enclosure screw may carry a self-tapping thread that enables the threaded end of the enclosure screw to tap its way into the second passage of the second boss when extended through the internal aperture of the first passage of the first boss and into the second passage of the second boss, and rotated via the tool.

The enclosure may further include a second threaded insert that is sized to engage interior surfaces of the second passage with a tight fit when inserted into the second passage, wherein: the second threaded insert is secured within the second passage; the threaded end of the enclosure screw carries a machine thread; and the second threaded insert defines a threaded fourth passage that extends through the second threaded insert to receive and engage the machine thread of the threaded end of the enclosure screw when the threaded end of the enclosure screw is extended into the threaded fourth passage of the second thread insert, and rotated via the tool.

The threaded third passage may have a diameter large enough to enable the head of the enclosure screw to pass therethrough such that the first threaded insert may be inserted into and secured within the first passage before the enclosure screw is inserted into and positioned within the first passage in an orientation that causes the head to extend toward the external aperture, and that causes the threaded end of the threaded shaft to extend through the internal aperture and into the enclosed volume.

The head of the enclosure screw may have a diameter that is too large to pass through the threaded third passage such that the first threaded insert must be inserted into and secured within the first passage after the enclosure screw is inserted into the first passage to enable the enclosure screw to be positioned within the first passage in an orientation that causes the head to extend toward the external aperture, and that causes the threaded end of the threaded shaft to extend through the internal aperture and into the enclosed volume.

The first boss and the second boss may extend into the interior volume; the internal aperture of the first passage may open through a first engagement surface of the first boss; the second passage may open through a second engagement surface of the second boss; and a selected one of the first engagement surface and the second engagement surface may include a concave formation to receive and engage the non-selected one of the first engagement surface and the second engagement surface in a manner that acts to align the first passage and the second passage to better enable the threaded end of the enclosure screw to extend from the internal aperture of the first passage and into the second passage.

The first boss may be integrated into a first wall of the first portion of the enclosure.

The second boss may be integrated into a second wall of the second portion of the enclosure that becomes coextensive with the first wall when the first portion and the second portion of the enclosure are assembled.

The enclosure may enclose a circuit board that carries an optical scanning component such that the enclosure is a component of an optical scanning device.

The mounting screw and the first threaded insert may cooperate to mount the optical scanning device to a selected structure external to the enclosure, and at a selected position and orientation to scan indicia carried on surface portions of objects placed in a field of view (FOV) of the optical scanning component to retrieve data encoded within the indicia.

The enclosure may enclose a circuit board that carries electronic components such that the enclosure is a component of an electronic device.

A method of assembling an enclosure that encloses an interior volume, includes forming a first boss integrally with a first portion of the enclosure to extend into the interior volume and to define a first passage that extends through the first boss to communicate between the interior volume and an environment external to the enclosure, wherein: the first passage defines an external aperture where the first passage opens into the external environment through an external surface of the first portion of the enclosure; and the first passage defines an internal aperture where the first passage opens into the interior volume through a first engagement surface of the first boss. The method also includes forming a second boss integrally with a second portion of the enclosure to extend into the interior volume and defines a second passage that extends at least partially through the second boss, wherein the second passage opens into the interior volume through a second engagement surface of the second boss; and inserting an enclosure screw having an elongate threaded shaft portion and a head formed at a head end of the threaded shaft portion into the first passage in an orientation that causes the head to extend toward the external aperture, and that causes a threaded end of the threaded shaft portion that is opposite the head end to extend through the internal aperture, into the enclosed volume and toward the second passage of the second boss, wherein: the head is enlarged relative to the head end of the threaded shaft portion to provide an annular screw shoulder to engage an annular aperture shoulder within the first passage that surrounds the internal aperture to retain the head end of the enclosure screw within the first passage; and the head carries a tool engagement formation to enable the enclosure screw to be engaged with an engagement tip of a tool to rotate the enclosure screw within the first passage to cause the threaded end of the enclosure screw to engage interior surfaces of the second passage to draw together the first and second portions of the enclosure to enclose the interior volume. The method further includes inserting a first threaded insert into the first passage through the external aperture, wherein: the first threaded insert is sized to engage interior surfaces of the first passage that surround the external aperture with a tight fit to secure the first threaded insert within the first passage at a location closer to the external aperture than the internal aperture, and with the head of the enclosure screw disposed between the first threaded insert and the aperture shoulder surrounding the internal aperture; and the first threaded insert defines a threaded third passage that extends through the first threaded insert to receive and engage an elongate threaded portion of a mounting screw inserted into the third passage from the environment external to the enclosure. The method still further includes inserting the engagement tip through the threaded third passage to engage the tool engagement formation of the enclosure screw; and with the threaded end of the enclosure screw extending through the internal aperture of the first passage of the first boss and into the second passage of the second boss, and with the engagement tip of the tool engaging the engagement formation of the head of the enclosure screw, operating the tool to cause rotation of the enclosure screw to draw together the first portion and the second portion of the enclosure to cause cooperation between at least the first portion and the second portion of the enclosure to enclose the internal volume.

The method may further include inserting a second threaded insert into the second passage, wherein: the second threaded insert is sized to engage interior surfaces of the second passage with a tight fit when the second threaded insert is inserted into the second passage to secure the second threaded insert within the second passage; the threaded end of the enclosure screw carries a machine thread; and the second threaded insert defines a threaded fourth passage that extends through the second threaded insert to receive and engage the machine thread of the threaded end of the enclosure screw when the threaded end of the enclosure screw is extended into the threaded fourth passage of the second thread insert, and rotated via the tool.

A selected one of the first engagement surface and the second engagement surface may include a concave formation to receive and engage the non-selected one of the first engagement surface and the second engagement surface in a manner that acts to align the first passage and the second passage to better enable the threaded end of the enclosure screw to extend from the internal aperture of the first passage and into the second passage. The method includes inserting the non-selected one of the first engagement surface and the second engagement surface into the concave formation of the selected one of the first engagement surface and the second engagement surface prior to insertion of the threaded end of the enclosure screw through the internal aperture of the first passage of the first boss and into the second passage of the second boss.

Various other components may be included and called upon for providing for aspects of the teachings herein. For example, additional materials, combinations of materials, and/or omission of materials may be used to provide for added embodiments that are within the scope of the teachings herein.

Standards for performance, selection of materials, functionality, and other discretionary aspects are to be determined by a user, designer, manufacturer, or other similarly interested party. Any standards expressed herein are merely illustrative and are not limiting of the teachings herein.

When introducing elements of the present invention or the embodiment(s) thereof, the articles "a," "an," and "the" are intended to mean that there are one or more of the elements. Similarly, the adjective "another," when used to introduce an element, is intended to mean one or more elements. The terms "including" and "having" are intended to be inclusive such that there may be additional elements other than the listed elements.

While the invention has been described with reference to illustrative embodiments, it will be understood by those skilled in the art that various changes may be made and equivalents may be substituted for elements thereof without departing from the scope of the invention. In addition, many modifications will be appreciated by those skilled in the art to adapt a particular instrument, situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A boss assembly comprising:
  a first boss formed integrally with a first portion of an enclosure, wherein:
    the first portion of the enclosure cooperates with at least a second portion of the enclosure to at least partly enclose an interior volume;
    the first boss defines a first passage that extends through the first boss: and
    the first passage defines an external aperture where the first passage opens into an environment external to the enclosure through an external surface of the first portion of the enclosure, and an internal aperture where the first passage opens into the interior volume;

an enclosure screw having an elongate threaded shaft portion and a head formed at a head end of the threaded shaft portion, wherein:
- the enclosure screw is inserted into the first passage in an orientation that causes the head to extend toward the external aperture, and that causes a threaded end of the threaded shaft portion that is opposite the head end to extend through the internal aperture, into the interior volume and toward a second passage defined by a second boss of the second portion of the enclosure; and
- the head is enlarged relative to the head end of the threaded shaft portion to provide an annular screw shoulder to engage an annular aperture shoulder within the first passage that surrounds the internal aperture to retain the head end of the enclosure screw within the first passage; and a first threaded insert that is sized to engage interior surfaces of the first passage with a tight fit when inserted into the first passage, wherein:
- the first threaded insert is secured within the first passage at a location closer to the external aperture than the internal aperture, and with the head of the enclosure screw disposed between the first threaded insert and the aperture shoulder surrounding the internal aperture; and
- the first threaded insert defines a threaded third passage that extends through the first threaded insert, and wherein:
- the third passage is configured to enable a tip of a tool to extend therethrough to engage the head of the enclosure screw to rotate the enclosure screw within the first passage; and
- the third passage is configured to receive and engage an elongate threaded portion of a mounting screw inserted into the third passage from the environment external to the enclosure.

2. The boss assembly of claim 1, wherein the head of the enclosure screw carries a tool engagement formation to enable the enclosure screw to be engaged with a screw engagement formation carried by the tip of the tool to enable use of the tool to rotate the enclosure screw within the first passage to cause the threaded end of the enclosure screw to engage interior surfaces of the second passage to draw together the first and second portions of the enclosure to enclose the interior volume.

3. The boss assembly of claim 1, wherein the threaded end of the enclosure screw carries a self-tapping thread that enables the threaded end of the enclosure screw to tap its way into the second passage of the second boss when extended through the internal aperture of the first passage of the first boss and into the second passage of the second boss, and rotated via the tool.

4. The boss assembly of claim 3, further comprising the second boss.

5. The boss assembly of claim 4, wherein the second boss tapers as it extends into the interior volume from an inner surface of the second portion of the enclosure.

6. The boss assembly of claim 1, wherein:
- the threaded end of the enclosure screw carries a machine thread; and
- the second boss carries a second threaded insert that defines a threaded fourth passage to receive and engage the machine thread of the threaded end of the enclosure screw when the threaded end of the enclosure screw is extended through the internal aperture of the first passage of the first boss and into the threaded fourth passage of the second thread insert, and rotated via the tool.

7. The boss assembly of claim 6, further comprising the second boss and the second threaded insert.

8. The boss assembly of claim 1, wherein the first boss tapers as it extends into the interior volume from an inner surface of the first portion of the enclosure.

9. The boss assembly of claim 1, wherein the enclosure is formed by a molded thermoplastic.

10. The boss assembly of claim 1, wherein the first threaded insert is engaged with the interior surfaces of the first passage via at least one of a pressed fit, a welding, a heated fit, a chemical boding, an adhesive, or a threading.

11. A boss assembly comprising:
a first boss formed integrally with a first portion of an enclosure, wherein:
- the first portion of the enclosure cooperates with at least a second portion of the enclosure to at least partly enclose an interior volume;
- the first boss defines a first passage that extends through the first boss; and
- the first passage defines an external aperture where the first passage opens into an environment external to the enclosure through an external surface of the first portion of the enclosure, and an internal aperture where the first passage opens into the interior volume;

an enclosure screw having an elongate threaded shaft portion and a head formed at a head end of the threaded shaft portion, wherein:
- the enclosure screw is inserted into the first passage in an orientation that causes the head to extend toward the external aperture, and that causes a threaded end of the threaded shaft portion that is opposite the head end to extend through the internal aperture, into the interior volume and toward a second passage defined by a second boss of the second portion of the enclosure; and
- the head is enlarged relative to the head end of the threaded shaft portion to provide an annular screw shoulder to engage an annular aperture shoulder within the first passage that surrounds the internal aperture to retain the head end of the enclosure screw within the first passage; and a first threaded insert that is sized to engage interior surfaces of the first passage with a tight fit when inserted into the first passage, wherein:
- the first threaded insert is secured within the first passage at a location closer to the external aperture than the internal aperture, and with the head of the enclosure screw disposed between the first threaded insert and the aperture shoulder surrounding the internal aperture; and
- the first threaded insert defines a threaded third passage that extends through the first threaded insert, and wherein:
- the first boss and the second boss extend into the interior volume;
- the internal aperture of the first passage opens through a first engagement surface of the first boss;
- the second passage opens through a second engagement surface of the second boss; and a selected one of the first engagement surface and the second engagement surface comprises a concave formation to receive and engage the non-selected one of the first engagement surface and the second engagement surface in a manner that acts to align the first passage and the second passage to better enable the threaded end of the enclosure screw to extend from the internal aperture of the first passage and into the second passage.

12. The boss assembly of claim 11, wherein the first boss is integrated into a wall of the first portion of the enclosure.

13. An enclosure to enclose an interior volume, the enclosure comprising:
- a first portion of the enclosure that comprises a first boss formed integrally therewith, wherein:
  - the first boss defines a first passage that extends through the first boss: and
  - the first passage defines an external aperture where the first passage opens into an environment external to the enclosure through an external surface of the first portion of the enclosure, and an internal aperture where the first passage opens into an interior volume;
- a second portion of the enclosure that comprises a second boss formed integrally therewith, wherein:
  - the second portion of the enclosure cooperates with at least the first portion of the enclosure to at least partly enclose the interior volume;
  - the second boss defines a second passage that extends at least partially through the second boss; and
  - the second passage opens into the interior volume;
- an enclosure screw having an elongate threaded shaft portion and a head formed at a head end of the threaded shaft portion, wherein:
  - the enclosure screw is inserted into the first passage in an orientation that causes the head to extend toward the external aperture, and that causes a threaded end of the threaded shaft portion that is opposite the head end to extend through the internal aperture, into the interior volume and toward the second passage of the second boss: and
  - the head is enlarged relative to the head end of the threaded shaft portion to provide an annular screw shoulder to engage an annular aperture shoulder within the first passage that surrounds the internal aperture to retain the head end of the enclosure screw within the first passage; and
- a first threaded insert that is sized to engage interior surfaces of the first passage with a tight fit when inserted into the first passage,
wherein:
  - the first threaded insert is secured within the first passage at a location closer to the external aperture than the internal aperture, and with the head of the enclosure screw disposed between the first threaded insert and the aperture shoulder surrounding the internal aperture; and
  - the first threaded insert defines a threaded third passage that extends through the first threaded insert, and
wherein:
  - the third passage is configured to enable a tip of a tool to extend therethrough to engage the head of the enclosure screw to rotate the enclosure screw within the first passage; and
  - the third passage is configured to receive and engage an elongate threaded portion of a mounting screw inserted into the third passage from the environment external to the enclosure.

14. The enclosure of claim 13, wherein the head of the enclosure screw carries a tool engagement formation to enable the enclosure screw to be engaged with a screw engagement formation carried by the tip of the tool to enable use of the tool to rotate the enclosure screw within the first passage to cause the threaded end of the enclosure screw to engage interior surfaces of the second passage to draw together the first and second portions of the enclosure to enclose the interior volume.

15. The enclosure of claim 13, wherein the threaded end of the enclosure screw carries a self-tapping thread that enables the threaded end of the enclosure screw to tap its way into the second passage of the second boss when extended through the internal aperture of the first passage of the first boss and into the second passage of the second boss, and rotated via the tool.

16. The enclosure of claim 13, further comprising a second threaded insert that is sized to engage interior surfaces of the second passage with a tight fit when inserted into the second passage, wherein:
- the second threaded insert is secured within the second passage;
- the threaded end of the enclosure screw carries a machine thread; and
- the second threaded insert defines a threaded fourth passage that extends through the second threaded insert to receive and engage the machine thread of the threaded end of the enclosure screw when the threaded end of the enclosure screw is extended into the threaded fourth passage of the second thread insert, and rotated via the tool.

17. The enclosure of claim 13, wherein the enclosure encloses a circuit board that carries an optical scanning component such that the enclosure is a component of an optical scanning device.

18. The enclosure of claim 17, wherein the mounting screw and the first threaded insert cooperate to mount the optical scanning device to a selected structure external to the enclosure, and at a selected position and orientation to scan indicia carried on surface portions of objects placed in a field of view (FOV) of the optical scanning component to retrieve data encoded within the indicia.

19. The enclosure of claim 13, wherein the enclosure encloses a circuit board that carries electronic components such that the enclosure is a component of an electronic device.

20. The enclosure of claim 19, wherein the electronic device is an optical scanner configured to scan indicia carried by an object.

21. An enclosure to enclose an interior volume, the enclosure comprising:
- a first portion of the enclosure that comprises a first boss formed integrally therewith, wherein:
  - the first boss defines a first passage that extends through the first boss: and
  - the first passage defines an external aperture where the first passage opens into an environment external to the enclosure through an external surface of the first portion of the enclosure, and an internal aperture where the first passage opens into an interior volume;
- a second portion of the enclosure that comprises a second boss formed integrally therewith, wherein:
  - the second portion of the enclosure cooperates with at least the first portion of the enclosure to at least partly enclose the interior volume;

the second boss defines a second passage that extends at least partially through the second boss; and the second passage opens into the interior volume;

an enclosure screw having an elongate threaded shaft portion and a head formed at a head end of the threaded shaft portion, wherein:

the enclosure screw is inserted into the first passage in an orientation that causes the head to extend toward the external aperture, and that causes a threaded end of the threaded shaft portion that is opposite the head end to extend through the internal aperture, into the interior volume and toward the second passage of the second boss; and the head is enlarged relative to the head end of the threaded shaft portion to provide an annular screw shoulder to engage an annular aperture shoulder within the first passage that surrounds the internal aperture to retain the head end of the enclosure screw within the first passage; and a first threaded insert that is sized to engage interior surfaces of the first passage with a tight fit when inserted into the first passage, wherein:

the first threaded insert is secured within the first passage at a location closer to the external aperture than the internal aperture, and with the head of the enclosure screw disposed between the first threaded insert and the aperture shoulder surrounding the internal aperture; and the first threaded insert defines a threaded third passage that extends through the first threaded insert, and wherein:

the first boss and the second boss extend into the interior volume;

the internal aperture of the first passage opens through a first engagement surface of the first boss;

the second passage opens through a second engagement surface of the second boss; and a selected one of the first engagement surface and the second engagement surface comprises a concave formation to receive and engage the non-selected one of the first engagement surface and the second engagement surface in a manner that acts to align the first passage and the second passage to better enable the threaded end of the enclosure screw to extend from the internal aperture of the first passage and into the second passage.

22. The enclosure of claim 21, wherein the first boss is integrated into a first wall of the first portion of the enclosure.

23. The enclosure of claim 22, wherein the second boss is integrated into a second wall of the second portion of the enclosure that becomes coextensive with the first wall when the first portion and the second portion of the enclosure are assembled.

* * * * *